United States Patent
Natsuhara et al.

(10) Patent No.: US 11,784,585 B2
(45) Date of Patent: Oct. 10, 2023

(54) POWER CONVERTER

(71) Applicant: Mitsubishi Electric Corporation, Tokyo (JP)

(72) Inventors: Hiroya Natsuhara, Tokyo (JP); Yoshihiko Kimpara, Tokyo (JP); Isao Kezobo, Tokyo (JP); Tatsuya Mori, Tokyo (JP); Akira Furukawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 673 days.

(21) Appl. No.: 16/975,220

(22) PCT Filed: Apr. 18, 2018

(86) PCT No.: PCT/JP2018/015936
§ 371 (c)(1),
(2) Date: Aug. 24, 2020

(87) PCT Pub. No.: WO2019/202675
PCT Pub. Date: Oct. 24, 2019

(65) Prior Publication Data
US 2020/0412277 A1    Dec. 31, 2020

(51) Int. Cl.
*H02M 7/538* (2007.01)
*H02M 7/5387* (2007.01)
(Continued)

(52) U.S. Cl.
CPC .......... *H02M 7/53875* (2013.01); *B62D 5/04* (2013.01); *H02P 27/06* (2013.01); *H02P 29/68* (2016.02); *H03K 17/145* (2013.01)

(58) Field of Classification Search
CPC .... H02M 7/53875; H02P 29/68; H02P 27/06; B62D 5/04; H03K 17/145
See application file for complete search history.

(56) References Cited

U.S. PATENT DOCUMENTS

2015/0188530 A1*  7/2015  Shinohara ......... H02M 7/53875
                                                  327/172
2016/0111973 A1    4/2016  Deflorio
(Continued)

FOREIGN PATENT DOCUMENTS

DE    10 2013 222 166 A1    4/2015
JP       2005-253200 A       9/2005
(Continued)

OTHER PUBLICATIONS

Communication dated Oct. 6, 2020, issued by the Japanese Patent Office in application No. 2020-514837.
(Continued)

*Primary Examiner* — Rafael O De Leon Domenech
(74) *Attorney, Agent, or Firm* — Sughrue Mion, PLLC; Richard C. Turner

(57) ABSTRACT

To provide a power converter which can distribute heat generation of the switching devices with good accuracy, even when the maximum heating phase of the positive electrode side and the maximum heating phase of the negative electrode side are different phases, and even when the maximum heating phase of the positive electrode side and the maximum heating phase of the negative electrode side changes before and after combining the offset voltage. The power converter calculates the offset voltage that makes the positive electrode side maximum heating evaluation value and the negative electrode side maximum heating evaluation value coincide with each other, in a state of controlling on/off the switching devices based on the combined AC voltage commands of the offset voltage.

17 Claims, 14 Drawing Sheets

(51) Int. Cl.
  *H02P 29/68* (2016.01)
  *B62D 5/04* (2006.01)
  *H02P 27/06* (2006.01)
  *H03K 17/14* (2006.01)

(56) References Cited

U.S. PATENT DOCUMENTS

2017/0021356 A1* 1/2017 Dority ................. B01L 3/50273
2017/0331398 A1   11/2017 Sugawara et al.

FOREIGN PATENT DOCUMENTS

JP   2015-126606 A    7/2015
JP   2015-527031 A    9/2015
WO   2016/125774 A1   8/2016

OTHER PUBLICATIONS

Extended European Search Report dated Mar. 12, 2021 from the European Patent Office in EP application No. 18915536.9.
International Search Report for PCT/JP2018/015936 dated May 22, 2018 [PCT/ISA/210].
Written Opinion for PCT/JP2018/015936 dated May 22, 2018 [PCT/ISA/237].

* cited by examiner

POWER CONVERTER

CROSS REFERENCE TO RELATED APPLICATIONS

This application is a National Stage of International Application No. PCT/JP2018/015936 filed Apr. 18, 2018.

TECHNICAL FIELD

The present disclosure relates to a power converter which converts from a DC power source to AC power supplied to a total phase number, which is set to greater than or equal to three, of electric loads.

BACKGROUND ART

In the power converter of poly-phase, which is greater than or equal to three-phase, by applying the offset voltage equally to the AC voltage commands of all phases, distribution of energizing times of the positive electrode side switching device and the negative electrode side switching device in the series circuit of each phase can be changed, without changing the current flowing into the electric load of each phase. The technology of distributing heat generation of the switching devices to the positive electrode side and the negative electrode side, and reducing heat generation of the switching device whose heat generation becomes the maximum is known.

For example, in the technology of PLT 1, supposing that the phase in which the absolute value of the AC voltage command before applying the offset voltage becomes the maximum is the maximum heating phase, the offset voltage that makes the energizing times of the positive electrode side and the negative electrode side switching devices of the maximum heating phase coincides is applied.

In the technology of PLT 2, the heating amount of all the switching devices before applying the offset voltage is calculated every time, the maximum heating switching device of the positive electrode side whose heating amount becomes the maximum is selected from the positive electrode side switching devices, the maximum heating switching device of the negative electrode side whose heating amount becomes the maximum is selected from the negative electrode side switching devices, and the offset voltage that makes the difference between the heating amount of the maximum heating switching device of the positive electrode side and the heating amount of the maximum heating switching device of the negative electrode side become 0 is applied.

CITATION LIST

Patent Literature

PLT 1: JP 2005-253200 A
PLT 2: WO 2016/125774 A

SUMMARY OF INVENTION

Technical Problem

In the technology of PLT 1, in the case where the maximum heating phase of the positive electrode side and the maximum heating phase of the negative electrode side are the same, heat generation of the positive electrode side and the negative electrode side switching devices of the maximum heating phase is distributed equally, and the maximum heating amount is reduced. However, the case where the maximum heating phase of the positive electrode side and the maximum heating phase of the negative electrode side are different is not considered. Therefore, in the case of becoming the different phase, since selection of the maximum heating phase is mistaken, there is the case where heat generation of the switching device of one side increases, and the maximum heating amount increases more than the case where the offset voltage is not added.

In the technology of PLT 2, heat distribution is possible even in the case where the maximum heating phase of the positive electrode side and the maximum heating phase of the negative electrode side are different. However, there is a phase interval in which the maximum heating phase changes before and after applying the offset voltage. In the technology of PLT 2, the heating amount before applying the offset voltage is calculated, and the heating amount after applying the offset voltage is not considered. Accordingly, in a partial phase interval, since selection of the maximum heating phase is mistaken, heating amount cannot be distributed accurately. Especially, when the amplitude of the AC voltage commands is large, the difference between the maximum heating amount of the positive electrode side and the maximum heating amount of the negative electrode side becomes large, and the influence of selection mistake becomes large. In the technology of PLT 2, since the heating amounts of all the switching devices are calculated, those results are compared, and the maximum heating phase is selected, calculation load becomes large.

Thus, it is desired to provide a power converter which can distribute heat generation of the switching devices with good accuracy, even when the maximum heating phase of the positive electrode side and the maximum heating phase of the negative electrode side are different, and even when the maximum heating phase of the positive electrode side and the maximum heating phase of the negative electrode side changes before and after combining the offset voltage.

Solution to Problem

A power converter, according to present disclosure, which converts from a DC power source to AC power supplied to a total phase number, which is set to greater than or equal to three, of electric loads, the power converter including:

an inverter circuit that is provided with the total phase number of series circuits in each of which a positive electrode side switching device connected to a positive electrode side of the DC power source and a negative electrode side switching device connected to a negative electrode side of the DC power source are connected in series and which a connection node of series connection is connected to the electric load of corresponding phase;

a voltage command basic value calculation unit that calculates the total phase number of AC voltage command basic values;

an offset voltage calculation unit that calculates an offset voltage;

a combined voltage command calculation unit that calculates the total phase number of combined AC voltage commands by combining the offset voltage to each of the total phase number of the AC voltage command basic values; and a switching control unit that controls on/off the switching devices of each of the total phase number of the series circuits, based on each of the total phase number of the combined AC voltage commands, wherein the offset voltage calculation unit calculates the offset voltage that makes a positive electrode side maximum heating evaluation value and a negative electrode side maximum heating evaluation value coincide with each other, in a state of controlling on/off the switching devices based on the combined AC voltage commands, wherein the positive electrode side maximum heating evaluation value is an evaluation value of the positive electrode side switching device whose an evaluation value of heating amount becomes maximum in the total phase number of the positive electrode side switching devices, and wherein the negative electrode side maximum heating evaluation value is an evaluation value of the negative electrode side switching device whose an evaluation value of heating amount becomes maximum in the total phase number of the negative electrode side switching devices.

Advantage of Invention

According to the power converter of present disclosure, by changing the offset voltage so that the heating evaluation value of the positive electrode side maximum heating switching device and the heating evaluation value of the negative electrode side maximum heating switching device balance after combining the offset voltage, the heating evaluation value of the maximum heating switching device in the total phase number of the positive electrode side and the negative electrode side switching devices can be minimized, and heat generation can be distributed. Therefore, even when the maximum heating phase of the positive electrode side and the maximum heating phase of the negative electrode side are different, and even when the maximum heating phase of the positive electrode side and the maximum heating phase of the negative electrode side changes before and after combining the offset voltage, heat generation of the switching devices can be distributed with good accuracy.

DETAILED DESCRIPTION OF THE EMBODIMENTS

1. Embodiment 1

Figure 1:
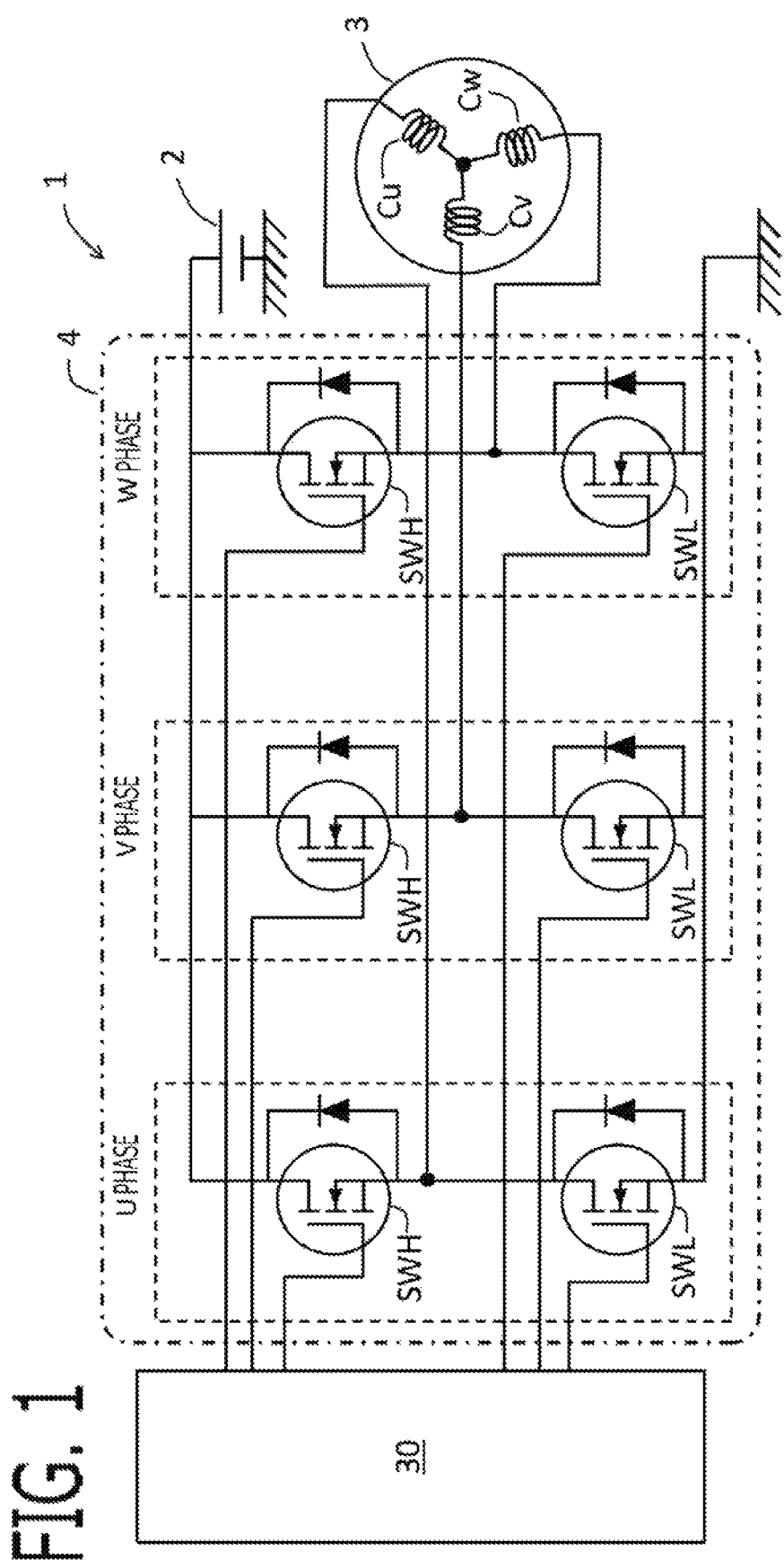
FIG. 1 is a whole configuration figure of the power converter according to Embodiment 1.

A power converter 1 according to Embodiment 1 will be explained with reference to drawings. The power converter 1 converts from a DC power source 2 to AC power supplied to a total phase number of electric loads. The total phase number is set to greater than or equal to three. In the present embodiment, the total phase number of the electric loads are the total phase number of windings provided in the AC motor 3. FIG. 1 is a schematic configuration diagram of the power converter 1, the DC power source 2, and the AC motor 3 according to the present embodiment.

1-1. Configuration of AC Motor and Inverter Circuit

The AC motor 3 is provided with the total phase number, which is set to greater than or equal to three, of the windings. In the present embodiment, the total phase number is set to three and three-phase windings Cu, Cv, Cw of U phase, V phase, and W phase are provided. In the present embodiment, the AC motor 3 is a three-phase induction motor provided with a stator having the three-phase windings Cu, Cv, Cw, and a rotor having an electric cage type electric conductor. The three-phase windings Cu, Cv, Cw may be connected by a star connection, or may be connected by a delta connection.

The power converter 1 is converted from the DC power source 2 to AC power supplied to the three-phase windings Cu, Cv, Cw. The power converter 1 is provided with an inverter circuit 4 and a controller 30. The inverter circuit 4 is provides with the total phase number (in this example, three) of series circuits in each of which a positive electrode side switching device SWH and a negative electrode side switching device SWL are connected in series. The positive electrode side switching device SWH is connected to a positive electrode side of the DC power source 2, and the negative electrode side switching device SWL is connected to a negative electrode side of the DC power source 2. A connection node of series connection between the positive pole side switching device SWH and the negative pole side switching device SWL in the series circuit of each phase is connected to the winding of corresponding phase.

In the present embodiment, the inverter circuit 4 is provided with the series circuit of U phase connected to the winding Cu of U phase, the series circuit of V phase connected to the winding Cv of V phase, and the series circuit of W phase connected to the winding Cw of W phase. MOSFET (Metal Oxide Semiconductor Field Effect Transistor) in which a diode is connected in inverse parallel, IGBT (Insulated Gate Bipolar Transistor) in which a diode is connected in inverse parallel, or the like is used for the each switching device. Agate terminal of the each switching device is connected to the output circuit 93 of the controller 30. The each switching device is turned on or turned off by the control signal outputted from the output circuit 93 of the controller 30.

The DC power source 2 is a power source which supplies DC power to the power converter 1 (the inverter circuit 4). An electricity accumulation device, a DC power obtained by rectifying commercial AC power, or the like is used for the DC power source 2, for example.

1-2. Configuration of Controller

Figure 2:
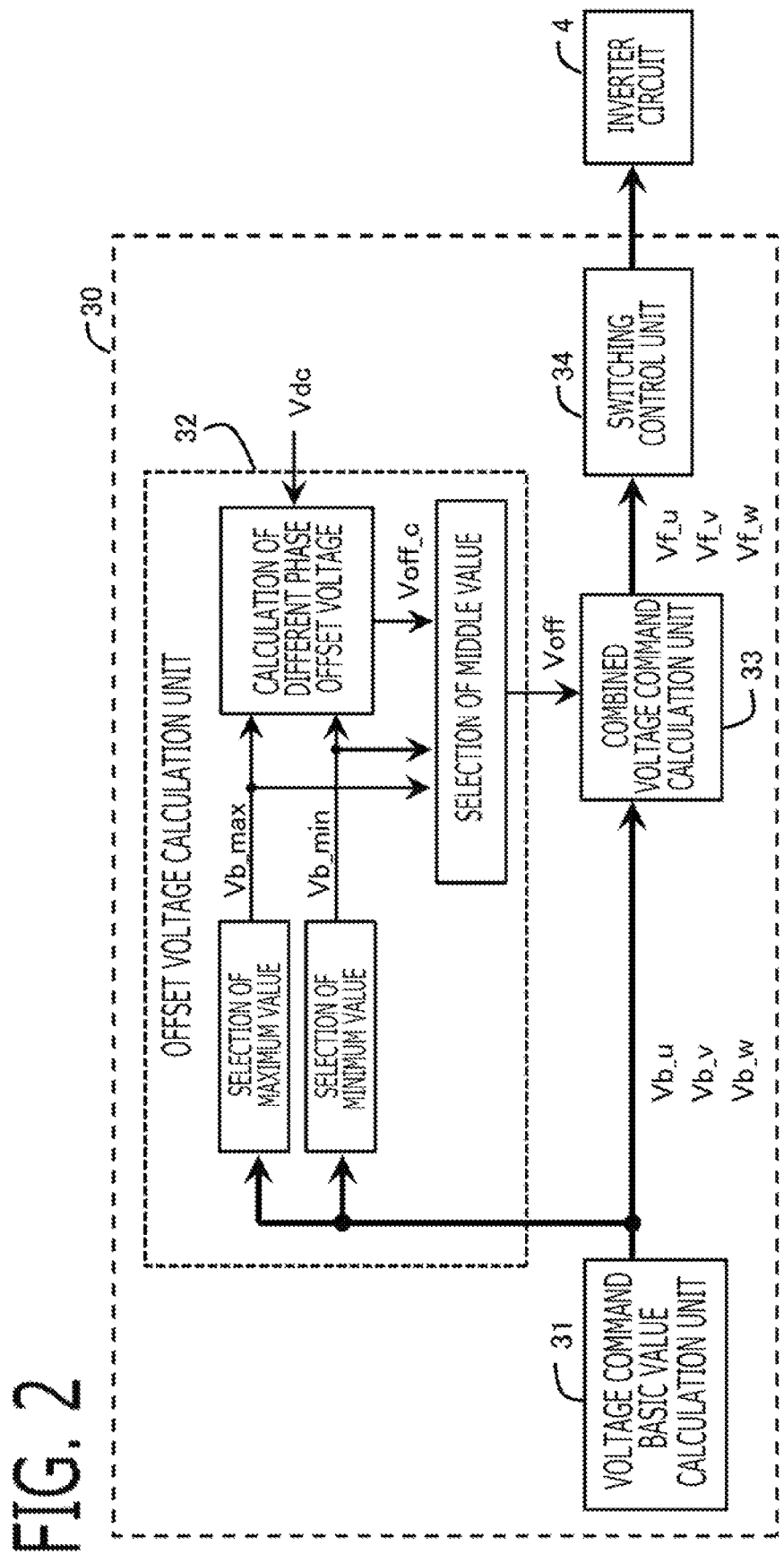
FIG. 2 is a block diagram of the controller according to Embodiment 1.
Figure 3:
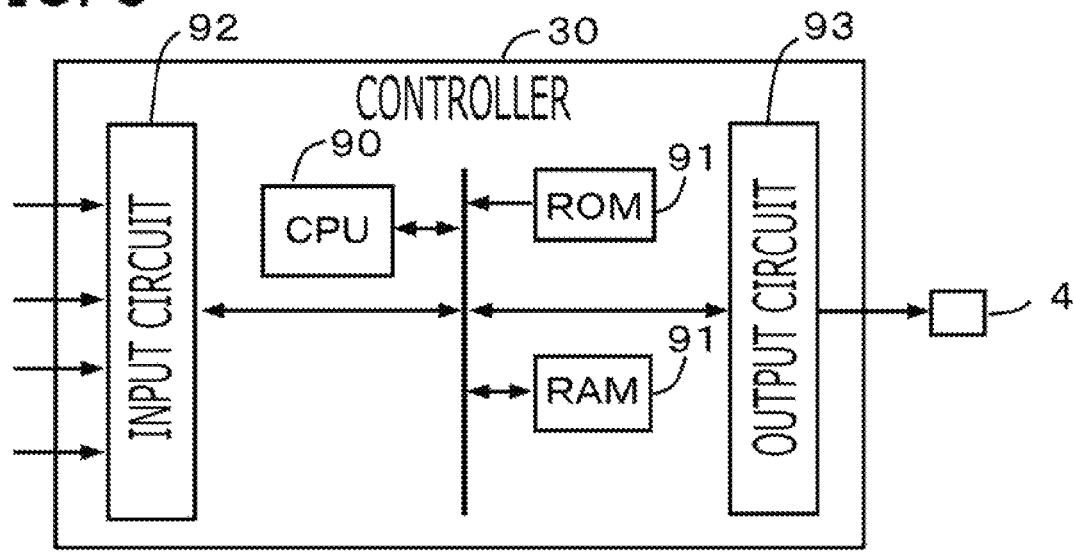
FIG. 3 is a hardware configuration diagram of the controller according to Embodiment 1.

The controller 30 controls the AC motor 3 by controlling the inverter circuit 4. As shown in FIG. 2, the controller 30 is provided with functional parts of a voltage command basic value calculation unit 31, an offset voltage calculation unit 32, a combined voltage command calculation unit 33, a switching control unit 34, and the like, described below. Each function of the controller 30 is realized by processing circuits provided in the controller 30. Specifically, as shown in FIG. 3, the controller 30 is provided with an arithmetic processor 90 such as a CPU (Central Processing Unit), storage apparatuses 91 that exchange data with the arithmetic processor 90, an input circuit 92 that inputs external signals to the arithmetic processor 90, and an output circuit 93 that outputs signals from the arithmetic processor 90 to the outside.

As the arithmetic processor 90, ASIC (Application Specific Integrated Circuit), IC (Integrated Circuit), DSP (Digital Signal Processor), FPGA (Field Programmable Gate Array), various kinds of logical circuits, various kinds of signal processing circuits, and the like may be provided. As the arithmetic processor 90, a plurality of the same type ones or the different type ones may be provided, and each processing may be shared and executed. As the storage apparatuses 91, there are provided a RAM (Random Access Memory) which can read data and write data from the arithmetic processor 90, a ROM (Read Only Memory) which can read data from the arithmetic processor 90, and the like. The input circuit 92 is connected with various kinds of sensors and such as the current sensor and the voltage sensor, and is provided with an A/D converter and the like for inputting signals from the sensors to the arithmetic processor 90. The output circuit 93 is connected with electric loads such as the gate terminal of the each switching device, and is provided with a driving circuit and the like for outputting a control signal from the arithmetic processor 90.

Then, the arithmetic processor 90 runs software items (programs) stored in the storage apparatus 91 such as a ROM and collaborates with other hardware devices in the controller 30, such as the storage apparatus 91, the input circuit 92, and the output circuit 93, so that the respective functions of the control units 31 to 34 included in the controller 50 are realized. Each function of the controller 30 will be described in detail below.

1-2-1. Voltage Command Basic Value Calculation Unit 31

The voltage command basic value calculation unit 31 calculates the total phase number of AC voltage command basic values. In the present embodiment, the total phase number is three. The voltage command basic value calculation unit 31 calculates the AC voltage command basic value Vb_u of U phase, the AC voltage command basic value Vb_v of V phase, and the AC voltage command basic value Vb_w of W phase. The voltage command basic value calculation unit 31 calculates the AC voltage command basic values Vb_u, Vb_v, Vb_w of three-phase by well-known vector control, V/f control, or the like.

As shown in an equation (1), the AC voltage command basic values Vb_u, Vb_v, Vb_w of three-phase have an amplitude D, and become sine waves (or cosine waves) which vibrate at a frequency of AC voltage command basic value. Phase of each phase is shifted by every 120 degrees in a period (360 degrees) of the AC voltage command basic value.

$$Vb\_u = D \times \sin(\theta)$$
$$Vb\_v = D \times \sin(\theta - 2\pi/3)$$
$$Vb\_w = D \times \sin(\theta + 2\pi/3) \qquad (1)$$

1-2-2. Combined Voltage Command Calculation Unit 33

The combined voltage command calculation unit 33 calculates the total phase number of combined AC voltage commands by combining an offset voltage Voff described below to each of the total phase number of the AC voltage command basic values. In the present embodiment, the combined voltage command calculation unit 33 calculates the combined AC voltage commands Vf_u, Vf_v, Vf_w of three-phase by subtracting the offset voltage Voff from each of the AC voltage command basic values Vb_u, Vb_v, Vb_w of three-phase, as shown in a next equation. The offset voltage Voff may be added to the AC voltage command basic values.

$$Vf\_u = Vb\_u - V\text{off}$$
$$Vf\_v = Vb\_v - V\text{off}$$
$$Vf\_w = Vb\_v - V\text{off} \qquad (2)$$

1-2-3. Switching Control Unit 34

Figure 4:
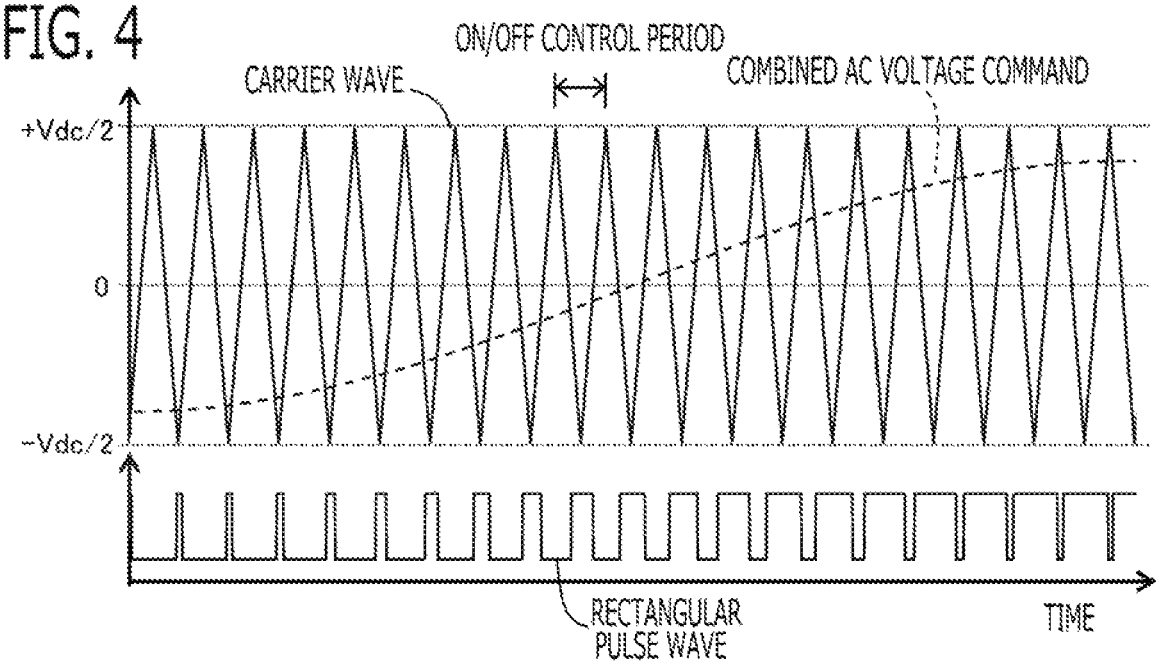
FIG. 4 is a time chart for explaining PWM control according to Embodiment 1.

The switching control unit 34 controls on/off the switching devices of each of the total phase number of the series circuits based on each of the total phase number of the combined AC voltage commands. The switching control unit 34 controls on/off the switching devices by PWM control (Pulse Width Modulation). As shown in FIG. 4, the switching control unit 34 compares each of the combined AC voltage commands Vf_u, Vf_v, Vf_w of three-phase with a carrier wave (triangular wave) which vibrates centering on 0 with an amplitude of DC voltage Vdc/2 at the on/off control period (PWM period). The switching control unit 34 turns on a rectangular pulse wave when the combined AC voltage command exceeds the carrier wave, and turns off the rectangular pulse wave when the combined AC voltage command bellows the carrier wave. About each phase, the switching control unit 34 turns on the positive electrode side switching device and turns off the negative electrode side switching device when the rectangular pulse wave is turned on. About each phase, the switching control unit 34 turns off the positive electrode side switching device and turns on the negative electrode side switching device when the rectangular pulse wave is turned off.

ON duty ratio Dutyp_x of the positive electrode side switching device and ON duty ratio Dutyn_x of the negative electrode side switching device in one on/off control period of x phase can be expressed like a next equation, using the combined AC voltage command Vf_x of x phase, the AC voltage command basic value Vb_x of x phase, and the offset voltage Voff. x phase becomes any one of U phase, V phase, and W phase.

$$Dutyp\_x = Vf\_x/Vdc + \tfrac{1}{2} = (Vb\_x - V\text{off})/Vdc + \tfrac{1}{2} \qquad (3\text{-}1)$$
$$Dutyn\_x = \tfrac{1}{2} - Vf\_x/Vdc = \tfrac{1}{2} - (Vb\_x - V\text{off})/Vdc \qquad (3\text{-}2)$$

1-2-4. Offset Voltage Calculation Unit 32

1-2-4-1. Derivation of Calculation Principle of Offset Voltage

<Deviation of Heating Amount of Switching Devices>

Since the period of the AC voltage command becomes long when the rotor is at extremely low rotation speed, exchange of phase that heating amount becomes the maximum by increase in the ON duty ratio becomes slow, and heat generation concentrates on a specific switching device.

An evaluation value of heating amount Q_x (hereinafter, referred to a heating evaluation value Q_x) of the switching device of the positive electrode side or the negative electrode side of x phase is defined. An equation (4) is the heating evaluation value Q_x on the supposition that the heating amount of the switching device of x phase is related with Joule heat which is proportional to a square of current I_x flowing into the winding of x phase. And, the heating evaluation value Q_x becomes a value obtained by multiplying the ON duty ratio Duty_x of the positive electrode side or the negative electrode side switching device of x phase to the square of current I_x of x phase. An equation (5) is the heating evaluation value Q_x on the supposition that the heating amount of the switching device of x phase is related with a magnitude of current I_x flowing into the winding of x phase. And, the heating evaluation value Q_x becomes a value obtained by multiplying the ON duty ratio Duty_x of the positive electrode side or the negative electrode side switching device of x phase to the magnitude (absolute value) of current I_x of x phase.

$$Q\_x = I\_x^2 \times \text{Duty}\_x \qquad (4)$$

$$Q\_x = |I\_x| \times \text{Duty}\_x \qquad (5)$$

Figure 5:
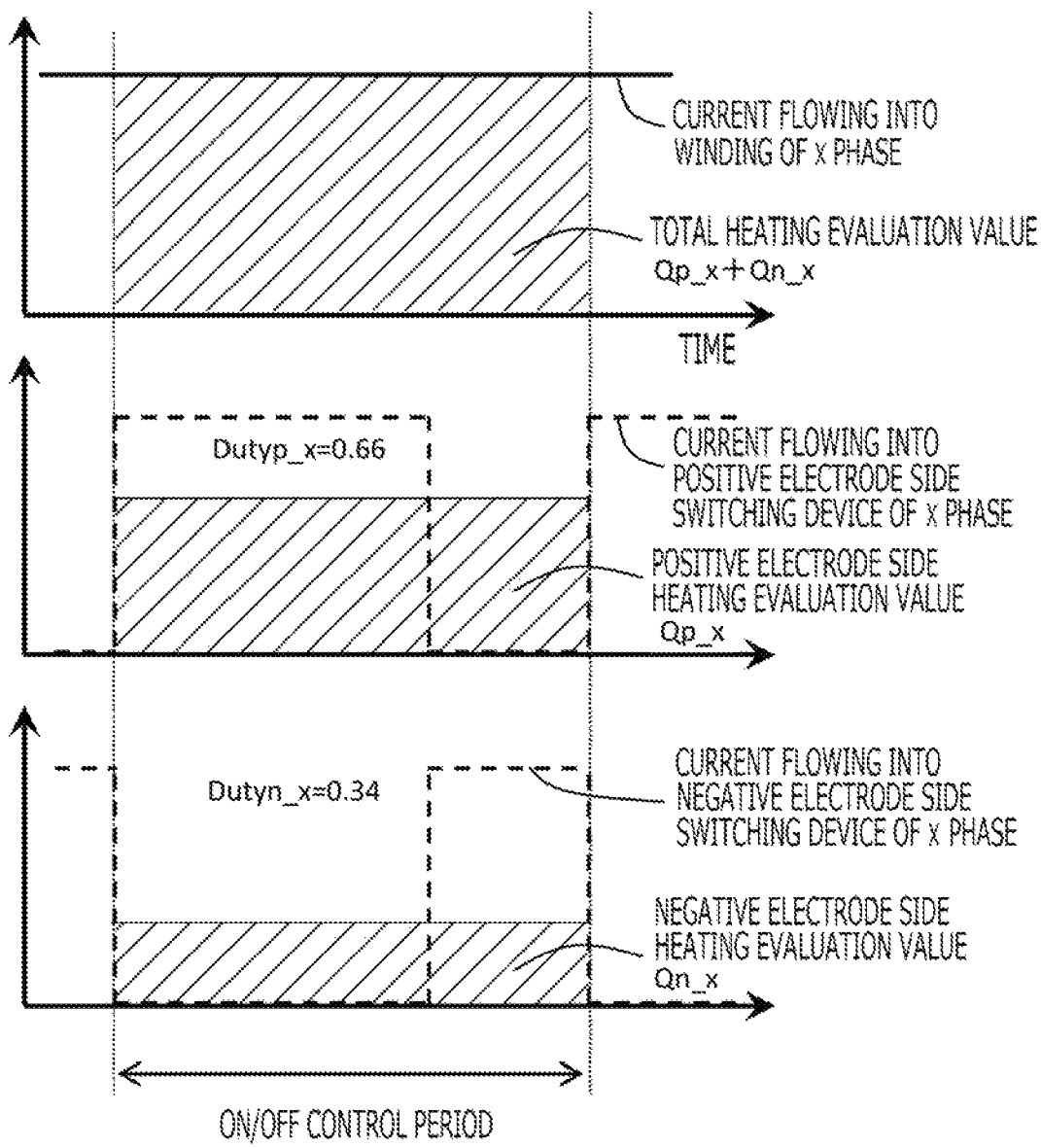
FIG. 5 is a time chart for explaining calculation of the heating evaluation values of the positive electrode side and the negative electrode side at the PWM control according to Embodiment 1.

FIG. 5 shows the heating evaluation value Qp_x of the positive electrode side switching device of x phase at the PWM control and the heating evaluation value Qn_x of the negative electrode side switching device of x phase in the case of the equation (5). The current with the same magnitude as the current I_x flowing into the winding of x phase flows through one of the positive electrode side and the negative electrode side switching device which is turned on. Therefore, the heating evaluation value of each of the positive electrode side and the negative electrode side switching devices change according to the each ON duty ratio. In the example shown in FIG. 5, the ON duty ratio Dutyp_x of the positive electrode side is 0.66, and the ON duty ratio Dutyn_x of the negative electrode side is 0.34. A total heating evaluation value of the positive electrode side and the negative electrode side is distributed to the heating evaluation value Qp_x of the positive electrode side and the heating evaluation value Qn_x of the negative electrode side according to the ON duty ratio Dutyp_x of the positive electrode side and the ON duty ratio Dutyn_x of the negative electrode side.

A ratio of the ON duty ratio Dutyp_x of the positive electrode side of x phase and the ON duty ratio Dutyn_x of the negative electrode side can be operated by changing the offset voltage Voff. When the offset voltage Voff is decreased, the ON duty ratios and the heating evaluation values of the positive electrode side switching devices of all phase increase, and the ON duty ratios and the heating evaluation values of the negative electrode side switching devices of all phase decrease. On the other hand, when the offset voltage Voff is increased, the ON duty ratios and the heating evaluation value of the positive electrode side switching devices of all phase decrease, and the ON duty ratios and the heating evaluation values of the negative electrode side switching devices of all phase increase. Since the interphase voltage (line voltage) does not change even when the offset voltage Voff is changed, the current flowing into the winding of each phase does not change.

<Condition that Minimizes Maximum Heating Evaluation Value>

A switching device whose the heating evaluation value becomes the maximum among the total phase number of the positive electrode side and the negative electrode side switching devices is defined as a maximum heating switching device. A switching device whose the heating evaluation value becomes the maximum among the total phase number of the positive electrode side switching devices is defined as a positive electrode side maximum heating switching device. A switching device whose the heating evaluation value becomes the maximum among the total phase number of the negative electrode side switching devices is defined as a negative electrode side maximum heating switching device.

In the case where the maximum heating switching device is the positive electrode side, when the offset voltage Voff is increased too much in order to decrease the heating evaluation value of the maximum heating switching device, the heating evaluation value Qmaxn of the negative electrode side maximum heating switching device is increased too much. On the other hand, in the case where the maximum heating switching device is the negative electrode side, when the offset voltage Voff is decreased too much in order to decrease the heating evaluation value of the maximum heating switching device, the heating evaluation value Qmaxp of the positive electrode side maximum heating switching device is increased too much.

Then, as shown in a next equation, by changing the offset voltage Voff so as to balance the heating evaluation value Qmaxp of the positive electrode side maximum heating switching device and the heating evaluation value Qmaxn of the negative electrode side maximum heating switching device, the heating evaluation value of the maximum heating switching device can be minimized.

$$Q\text{max}p = Q\text{max}n \qquad (6)$$

<Necessity of Evaluating the Maximum Heating Evaluation Value after Combining the Offset Voltage Voff>

When the offset voltage Voff is increased, the positive electrode side ON duty ratios of all phase change by the same value in the decrease direction, and the negative electrode side ON duty ratios of all phase change by the same value in the increase direction. However, as shown in the equation (4) or the equation (5), the heating evaluation value is a value obtained by multiplying the ON duty ratio to the square of current or the magnitude of current. Accordingly, even if the ON duty ratio of each phase changes by the same value, the change amount of the heating evaluation value of each phase is different according to the magnitude of the current of each phase. Therefore, the change amount of the heating evaluation value of a phase in which the magnitude of current is large becomes large with respect to change of the offset voltage Voff.

Accordingly, when the offset voltage Voff is changed, a phase interval in which the phase of the positive electrode side maximum heating switching device changes occurs, and a phase interval in which the phase of the negative electrode side maximum heating switching device changes occurs. Therefore, it is necessary to evaluate the positive electrode side maximum heating evaluation value Qmaxp and the negative electrode side maximum heating evaluation value Qmaxn by the ON duty ratio after combining the offset voltage Voff.

<A Method to Uniquely Calculate Offset Voltage Considering after Combining Offset Voltage>

For example, a method of performing repeated numerical computation also can be considered. That is to say, in each phase, the offset voltage Voff is changed little by little, the maximum heating switching devices of the positive electrode side and the negative electrode side are specified, each heating evaluation value is calculated, and the offset voltage Voff which satisfies the equation (6) is specified. However, computation load is increased. Then, without performing repeated numerical computation, a method of uniquely calculating the offset voltage Voff which satisfies the equation (6) will be derived.

In the case where the offset voltage Voff which satisfies the equation (6) is set, following three cases are supposed as combinations of phase of the positive electrode side maximum heating switching device and phase of the negative electrode side maximum heating switching device.

(Case a): In the case where the offset voltage which satisfies the equation (6) is set, it is supposed that phase of the positive electrode side maximum heating switching device and phase of the negative electrode side maximum heating switching device are the same phase, and when the offset voltage is 0, the heating evaluation value of the positive electrode side maximum heating switching device becomes larger than the heating evaluation value of the negative electrode side maximum heating switching device.

(Case b): In the case where the offset voltage which satisfies the equation (6) is set, it is supposed that phase of the positive electrode side maximum heating switching device and phase of the negative electrode side maximum heating switching device are the same phase, and when the offset voltage is 0, the heating evaluation value of the negative electrode side maximum heating switching device becomes larger than the heating evaluation value of the positive electrode side maximum heating switching device.

(Case c): In the case where the offset voltage which satisfies the equation (6) is set, it is supposed that after combining the offset voltage, phase of the positive electrode side maximum heating switching device and phase of the negative electrode side maximum heating switching device are different phases.

In the case a, when the offset voltage is 0, since the heating evaluation value of the positive electrode side maximum heating switching device becomes larger than the heating evaluation value of the negative electrode side maximum heating switching device, a phase with the largest current becomes the positive electrode side and the negative electrode side maximum heating switching devices after setting of the offset voltage which satisfies the equation (6). In the case b, when the offset voltage is 0, since the heating evaluation value of the negative electrode side maximum heating switching device becomes larger than the heating evaluation value of the positive electrode side maximum heating switching device, a phase with the smallest current becomes the positive electrode side and the negative electrode side maximum heating switching device after setting of the offset voltage which satisfies the equation (6). In the case c, after setting the offset voltage which satisfies the equation (6), a phase with the largest current becomes the positive electrode side maximum heating switching device, and a phase with the smallest current becomes the negative electrode side maximum heating switching device.

Since the current of each phase is proportional to the AC voltage command basic value of each phase, the maximum and the minimum of the AC voltage command basic values are used instead of the maximum and the minimum of currents. About phase in which the AC voltage command basic value becomes the maximum, the current which flows into winding is set to I_max, and the ON duty ratios of the positive electrode side and the negative electrode side after setting of the offset voltage are set to Dutyp_max and Dutyn_max, respectively. About phase in which the AC voltage command basic value becomes the minimum, the current which flows into winding is set to I_min, and the ON duty ratios of the positive electrode side and the negative electrode side after setting of the offset voltage are set to Dutyp_min and Dutyn_min, respectively.

<In the Case of Using the Heating Evaluation Value of the Equation (4)>

In the case of using the heating evaluation value of the equation (4), the maximum heating evaluation values Qmaxp, Qmaxn of the positive electrode side and the negative electrode side of each of the case a, the case b, and the case c become like the following an equation (7-a), an equation (7-b), and an equation (7-c).

$$Qmaxp = I\_max^2 \times Dutyp\_max, \quad Qmaxn = I\_max^2 \times Dutyn\_max \qquad (7\text{-a})$$

$$Qmaxp = I\_min^2 \times Dutyp\_min, \quad Qmaxn = I\_min^2 \times Dutyn\_min \qquad (7\text{-b})$$

$$Qmaxp = I\_max^2 \times Dutyp\_max, \quad Qmaxn = I\_min^2 \times Dutyn\_min \qquad (7\text{-c})$$

Herein, Dutyp_max, Dutyn_max, Dutyp_min, and Dutyn_min become like an equation (8-1) to an equation (8-4) from the equation (3-2) and the equation (3-1). Herein, Vb_max is the AC voltage command basic value of phase in which the AC voltage command basic value becomes the maximum. Vb_min is the AC voltage command basic value of phase in which the AC voltage command basic value becomes the minimum.

$$Dutyp\_max = (Vb\_max - Voff)/Vdc + \tfrac{1}{2} \qquad (8\text{-}1)$$

$$Dutyn\_max = \tfrac{1}{2} - (Vb\_max - Voff)/Vdc \qquad (8\text{-}2)$$

$$Dutyp\_min = (Vb\_min - Voff)/Vdc + \tfrac{1}{2} \qquad (8\text{-}3)$$

$$Dutyn\_min = \tfrac{1}{2} - (Vb\_min - Voff)/Vdc \qquad (8\text{-}4)$$

If a calculation equation of the offset voltage Voff so that the equation (6) of Qmaxp=Qmaxn is established is derived from the equation (6), the equation (7-a) to the equation (7-c), and the equation (8-1) to the equation (8-4), an equation (9-a), an equation (9-b), and an equation (9-c) are obtained. Specifically, each of the equation (7-a), the equation (7-b), and the equation (7-c) is substituted into the equation (6), the equation (8-1) to the equation (8-4) are substituted into the substituted equation, and then, each equation is derived by solving for the offset voltage Voff. Herein, Voff_a is the offset voltage in the case of the case a, and is referred to a positive electrode side same phase offset voltage. Voff_b is the offset voltage in the case of the case b, and is referred to a negative electrode side same phase offset voltage. Voff_c is the offset voltage in the case of the case c, and is referred to a different phase offset voltage. Vb_max is the AC voltage command basic value of phase in which the AC voltage command basic value becomes the maximum. Vb_min is the AC voltage command basic value of phase in which the AC voltage command basic value becomes the minimum.

$$Voff\_a = Vb\_max \qquad (9\text{-a})$$

$$Voff\_b = Vb\_min \qquad (9\text{-b})$$

$$Voff\_c = Vdc/2 \times (I\_max^2 - I\_min^2)/(I\_max^2 + I\_min^2) + (Vb\_max \times I\_max^2 + Vb\_min \times I\_min^2)/(I\_max^2 + I\_min^2) \qquad (9\text{-c})$$

<In the Case of Using the Heating Evaluation Value of the Equation (5)>

In the case of using the heating evaluation value of the equation (5), the maximum heating evaluation values Qmaxp, Qmaxn of the positive electrode side and the negative electrode side of each of the case a, the case b, and the case c become like the following an equation (10-a), an equation (10-b), and an equation (10-c). Herein, considering that the maximum current I_max becomes a positive value, and the minimum current I_min becomes a negative value, positive or negative sign is set.

$$Q\max p = I\_\max \times \text{Duty}p\_\max, \quad Q\max n = I\_\max \times \text{Duty}n\_\max \quad (10\text{-a})$$

$$Q\max p = -I\_\min \times \text{Duty}p\_\min, \quad Q\max n = -I\_\min \times \text{Duty}n\_\min \quad (10\text{-b})$$

$$Q\max p = I\_\max \times \text{Duty}p\_\max, \quad Q\max n = -I\_\min \times \text{Duty}n\_\min \quad (10\text{-c})$$

Similarly, if a calculation equation of the offset voltage Voff so that the equation (6) of Qmaxp=Qmaxn is established is derived from the equation (6), the equation (10-a) to the equation (10-c), and the equation (8-1) to the equation (8-4), an equation (11-a), an equation (11-b), and an equation (11-c) are obtained.

$$V\text{off}\_a = Vb\_\max \quad (11\text{-a})$$

$$V\text{off}\_b = Vb\_\min \quad (11\text{-b})$$

$$V\text{off}\_c = Vdc/2 \times (I\_\max + I\_\min)/(I\_\max - I\_\min) + (Vb\_\max \times I\_\max - Vb\_\min \times I\_\min)/(I\_\max - I\_\min) \quad (11\text{-c})$$

In the case of the case a and the case b, even when using the any heating evaluation value of the equation (4) and the equation (5), it becomes the same offset voltage like the equation (9-a) and the equation (11-a), the equation (9-b) and the equation (11-b). On the other hand, in the case of the case c, the offset voltages are different like the equation (9-c) and the equation (11-c), depending on whether the heating evaluation value of the equation (4) or the equation (5) is used.

<Calculation of Voff_c Using Current Estimation Value>

In order to calculate the different phase offset voltage Voff_c of the equation (9-c) and the equation (11-c) in the case of the case c, the maximum current I_max and the minimum current I_min of phases in which the AC voltage command basic value becomes the maximum and the minimum are required. Following is assumed for simplification of calculation. Herein, R is resistance of winding, and R_s is on-resistance of the switching device.

Assumption 1: R>>R_s

Assumption 2: the AC motor 3 is at extremely low rotation speed, and there is no voltage drop due to induced voltage and inductance.

By these assumptions, the law of Ohm shown in an equation (12-1) and an equation (12-2) is established, and the current of winding can be estimated from the AC voltage command basic values and the resistance R of winding.

$$I\_\max = Vb\_\max/R \quad (12\text{-1})$$

$$I\_\min = Vb\_\min/R \quad (12\text{-2})$$

If the equation (12-1) and the equation (12-2) are substituted into the equation (9-c) and the equation (11-c), an equation (9-c2) and an equation (11-c2) are obtained, respectively.

$$V\text{off}\_c = Vdc/2 \times (Vb\_\max^2 - Vb\_\min^2)/(Vb\_\max^2 + Vb\_\min^2) + (Vb\_\max^3 + Vb\_\min^3)/(Vb\_\max^2 + Vb\_\min^2) \quad (9\text{-c2})$$

$$V\text{off}\_c = (Vb\_\max + Vb\_\min) \times (1 + Vdc/2/(Vb\_\max - Vb\_\min)) \quad (11\text{-c2})$$

<Setting of Voff Based on Voff_a, Voff_b, Voff_c>

Figure 6:
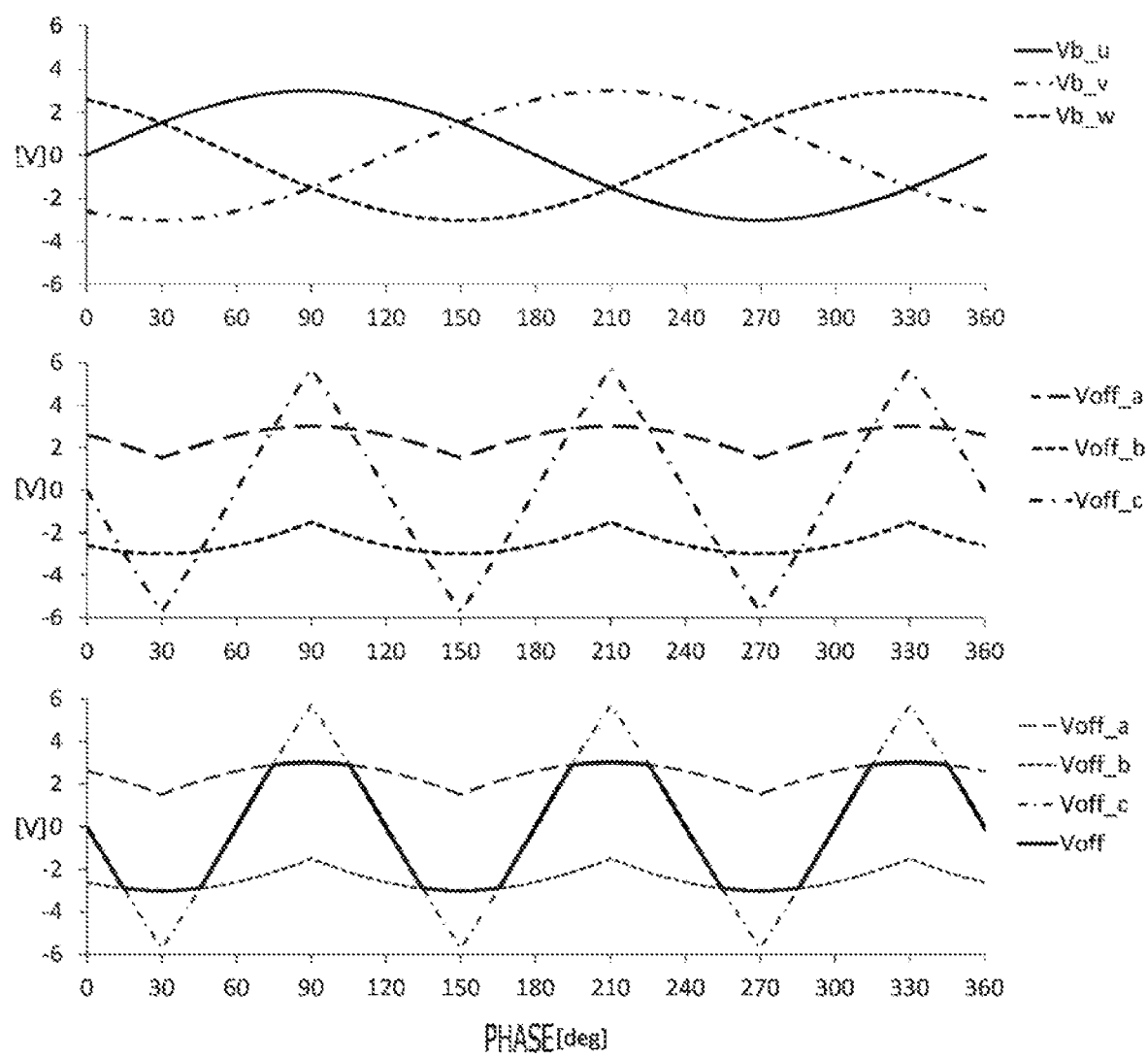
FIG. 6 is a time chart for explaining calculation of the offset voltage according to Embodiment 1.

The graph of the upper row of FIG. 6 shows a behavior of the AC voltage command basic values Vb_u, Vb_v, Vb_w of three-phase, when the DC voltage Vdc is 12V and the amplitude D of the AC voltage command basic value is 3V. The graph of the middle row of FIG. 6 shows a behavior of Voff_a, Voff_b, Voff_c which were calculated by the equation (9-a), the equation (9-b), and the equation (9-c2). As shown in these graphs, a phase interval when Voff_c exceeds Voff_a, and a phase interval when Voff_c bellows Voff_b occur. However, since the case c is the middle state of the case a and the case b, Voff_c does not exceed Voff_a and does not below Voff_b. And, since the case c is established when Voff_c is between Voff_a and Voff_b, the case a and the case b are not established and Voff_a and Voff_b cannot be selected.

Therefore, as shown in the graph of the lower row of FIG. 6, the offset voltage Voff which satisfies the equation (6) becomes Voff_a when Voff_c exceeds Voff_a, becomes Voff_c when Voff_c is between Voff_a and Voff_b, and becomes Voff_b when Voff_c bellows Voff_b. If this is expressed by simple arithmetic logic, Voff becomes the middle value in Voff_a, Voff_b, and Voff_c. This can be expressed by an equation (13) using a minimum value picking processing min( ) and a maximum value picking processing max( ).

$$V\text{off} = \max(\min(V\text{off}\_a, V\text{off}\_c), V\text{off}\_b) \quad (13)$$

1-2-4-2. Configuration of Offset Voltage Calculation Unit 32

Then, the offset voltage calculation unit 32 calculates the offset voltage Voff that makes the positive electrode side maximum heating evaluation value Qmaxp and the negative electrode side maximum heating evaluation value Qmaxn coincide with each other in a state of controlling on/off the switching devices based on the combined AC voltage commands of the offset voltage Voff. The positive electrode side maximum heating evaluation value Qmaxp is the evaluation value of the heating amount of the positive electrode side maximum heating switching device. The negative electrode side maximum heating evaluation value Qmaxn is the evaluation value of the heating amount of the negative electrode side maximum heating switching device.

According to this configuration, by changing the offset voltage Voff so that the heating evaluation value Qmaxp of the positive electrode side maximum heating switching device and the heating evaluation value Qmaxn of the negative electrode side maximum heating switching device balance after combining the offset voltage, the heating evaluation value of the maximum heating switching device in the total phase number of the positive electrode side and the negative electrode side switching devices can be minimized, and heat Generation can be distributed.

As mentioned above, the heating evaluation value regarding the heating amount of each switching device is a value calculated based on the current which flows into the winding from the series circuit of phase corresponding to the switching device, and the combined AC voltage command of phase corresponding to the switching device.

The heating evaluation value is set to an average value of the heating evaluation value in an average period shorter than a time constant of a delay of temperature change of the switching device to heating amount change of the switching device. In the present embodiment, the average period is set to the on/off control period. Then, as shown in FIG. 5, the equation (4), and the equation (5), the heating evaluation value is calculated using the ON duty ratio which corresponds to an average value of the ON period in the on/off control period. The ON duty ratio is calculated based on the combined AC voltage command, as shown in the equation (3-1) or the equation (3-2). In the present embodiment, the heating evaluation value is calculated by the calculation equation of the equation (4) or the equation (5).

The time constant of temperature change of the switching device corresponds to time until the temperature of the switching device reaches 63.2% of the final temperature from the initial temperature, after changing stepwise the heating amount of the switching device. The time constant is proportional to the heat capacity of the switching device, and becomes a sufficiently larger value than the on/off control period.

<Setting a Middle Value of Voff_c, Voff_a, Voff_b to the Offset Voltage>

In the present embodiment, as shown in the block diagram of FIG. 2, the offset voltage calculation unit 32 calculates a maximum value Vb_max in the total phase number of the AC voltage command basic values Vb_u, Vb_v, Vb_w (hereinafter, referred to as a maximum value Vb_max of AC voltage command basic value), based on the total phase number of the AC voltage command basic values Vb_u, Vb_v, Vb_w, as shown in an equation (14). As shown in an equation (15), the offset voltage calculation unit 32 calculates a minimum value Vb_min in the total phase number of the AC voltage command basic values Vb_u, Vb_v, Vb_w (hereinafter, referred to as a minimum value Vb_min of AC voltage command basic value), based on the total phase number of the AC voltage command basic values Vb_u, Vb_v, Vb_w.

$$Vb\_max = \max(Vb\_u, Vb\_v, Vb\_w) \quad (14)$$

$$Vb\_min = \min(Vb\_u, Vb\_v, Vb\_w) \quad (15)$$

Herein, the maximum value Vb_max of AC voltage command basic value is the offset voltage Voff_a that makes the positive electrode side maximum heating evaluation value Qmaxp and the negative electrode side maximum heating evaluation value Qmaxn coincide with each other, on the supposition (the case a) that a phase of the positive electrode side maximum heating switching device and a phase of the negative electrode side maximum heating switching device are the same phase, and that when the offset voltage is 0, the heating evaluation value of the positive electrode side maximum heating switching device becomes larger than the heating evaluation value of the negative electrode side maximum heating switching device. The positive electrode side maximum heating switching device is a positive electrode side switching device whose the heating evaluation value becomes the maximum in the total phase number of the positive electrode side switching devices. The negative electrode side maximum heating switching device is a negative electrode side switching device whose the heating evaluation value becomes the maximum in the total phase number of negative electrode side switching devices.

And, the minimum value Vb_min of AC voltage command basic value is the offset voltage Voff_b that makes the positive electrode side maximum heating evaluation value Qmaxp and the negative electrode side maximum heating evaluation value Qmaxn coincide with each other, on the supposition (the case b) that a phase of the positive electrode side maximum heating switching device and a phase of the negative electrode side maximum heating switching device are the same phase, and that when the offset voltage is 0, the heating evaluation value of the negative electrode side maximum heating switching device becomes larger than the heating evaluation value of the positive side maximum heating switching device.

The offset voltage calculation unit 32 calculates that different phase offset voltage Voff_c which is the offset voltage that makes the positive electrode side maximum heating evaluation value Qmaxp and the negative electrode side maximum heating evaluation value Qmaxn coincide with each other, on the supposition (the case c) that a phase of the positive electrode side maximum heating switching device and a phase of the negative electrode side maximum heating switching device are different phases.

In the case that the heating evaluation value of the equation (4) is employed, the offset voltage calculation unit 32 calculates the different phase offset voltage Voff_c using the equation (9-c). In the case that the heating evaluation value of the equation (5) is employed, the offset voltage calculation unit 32 calculates the different phase offset voltage Voff_c using the equation (11-c).

In the present embodiment, the offset voltage calculation unit 32 uses, as the maximum current I_max and the minimum current I_min used for the equation (9-c) or the equation (11-c), current estimation values calculated based on the AC voltage command basic value of corresponding phase, as shown in the equation (12-1) and the equation (12-2).

Then, in the case that the heating evaluation value of the equation (4) is employed, by using the equation (9-c2) obtained by substituting the equation (12-1) and the equation (12-2) into the equation (9-c), the offset voltage calculation unit 32 calculates the different phase offset voltage Voff_c based on the DC voltage Vdc, and the maximum value Vb_max and the minimum value Vb_min of AC voltage command basic value. In the case that the heating evaluation value of the equation (5) is employed, by using the equation (11-c2) obtained by substituting the equation (12-1) and the equation (12-2) into the equation (11-c), the offset voltage calculation unit 32 calculates the different phase offset voltage Voff_c based on the DC voltage Vdc, and the maximum value Vb_max and the minimum value Vb_min of AC voltage command basic value. The DC voltage Vdc may be a value detected using the voltage sensor, or may be a preliminarily set value.

As explained using FIG. 6 and the equation (13), the offset voltage calculation unit 32 calculates a middle value in the maximum value Vb_max of AC voltage command basic value (Voff_a), the minimum value Vb_min of AC voltage command basic value (Voff_b), and the different phase offset voltage Voff_c, as the offset voltage Voff.

In calculation of the offset voltages Voff_a, Voff_b, Voff_c, the maximum heating evaluation values Qmaxp, Qmaxn themselves are not calculated, but the offset voltages can be uniquely calculated using the calculation equations derived based on the calculation equations of the maximum heating evaluation values Qmaxp, Qmaxn. Therefore, it is not necessary to calculate the heating evaluation value of each switching device, and to perform repeated numerical computation, and calculation processing load can be reduced.

<Control Behavior>

Figure 7:
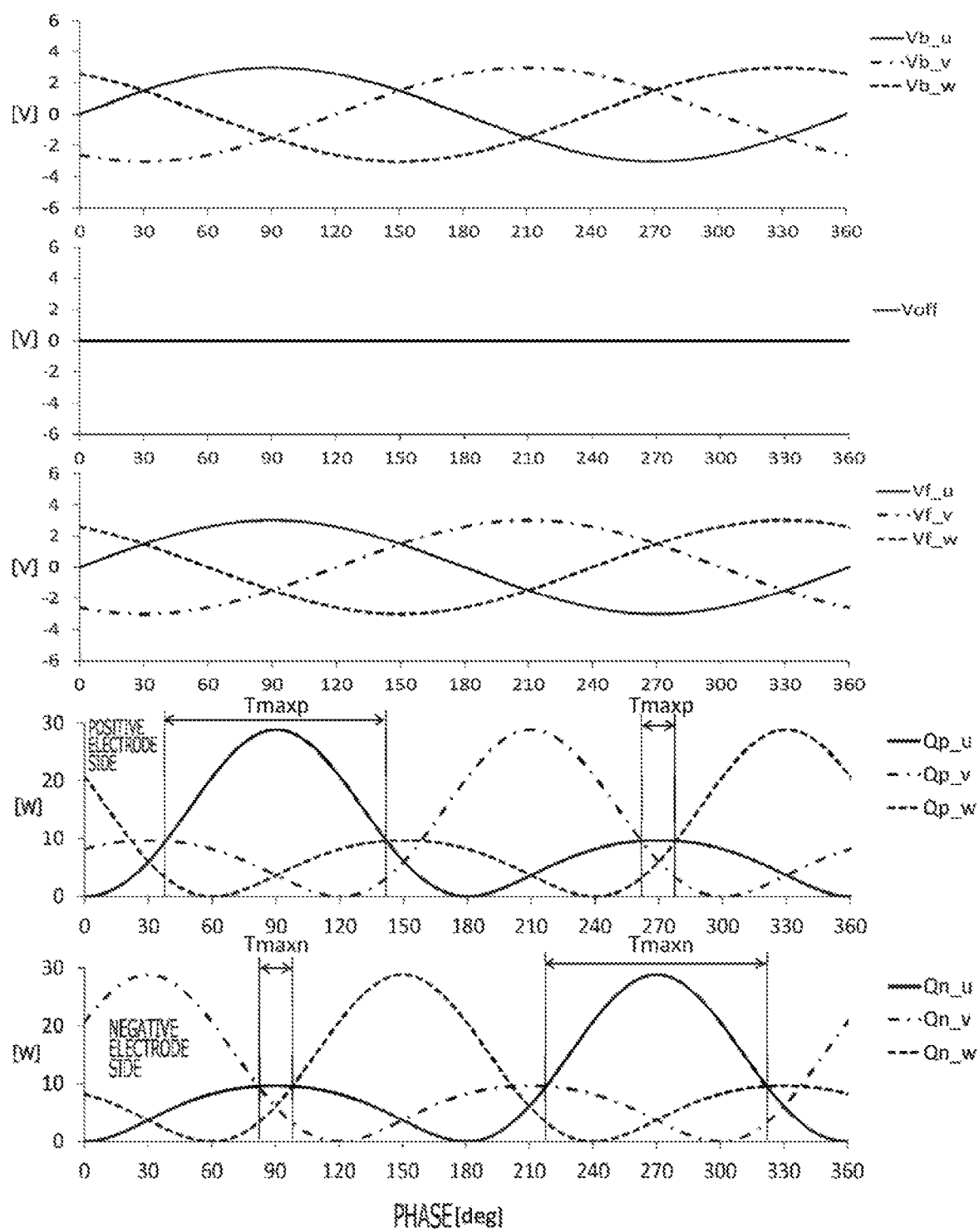
FIG. 7 is a time chart for explaining a control behavior according to a comparative example when the offset voltage is 0.
Figure 8:
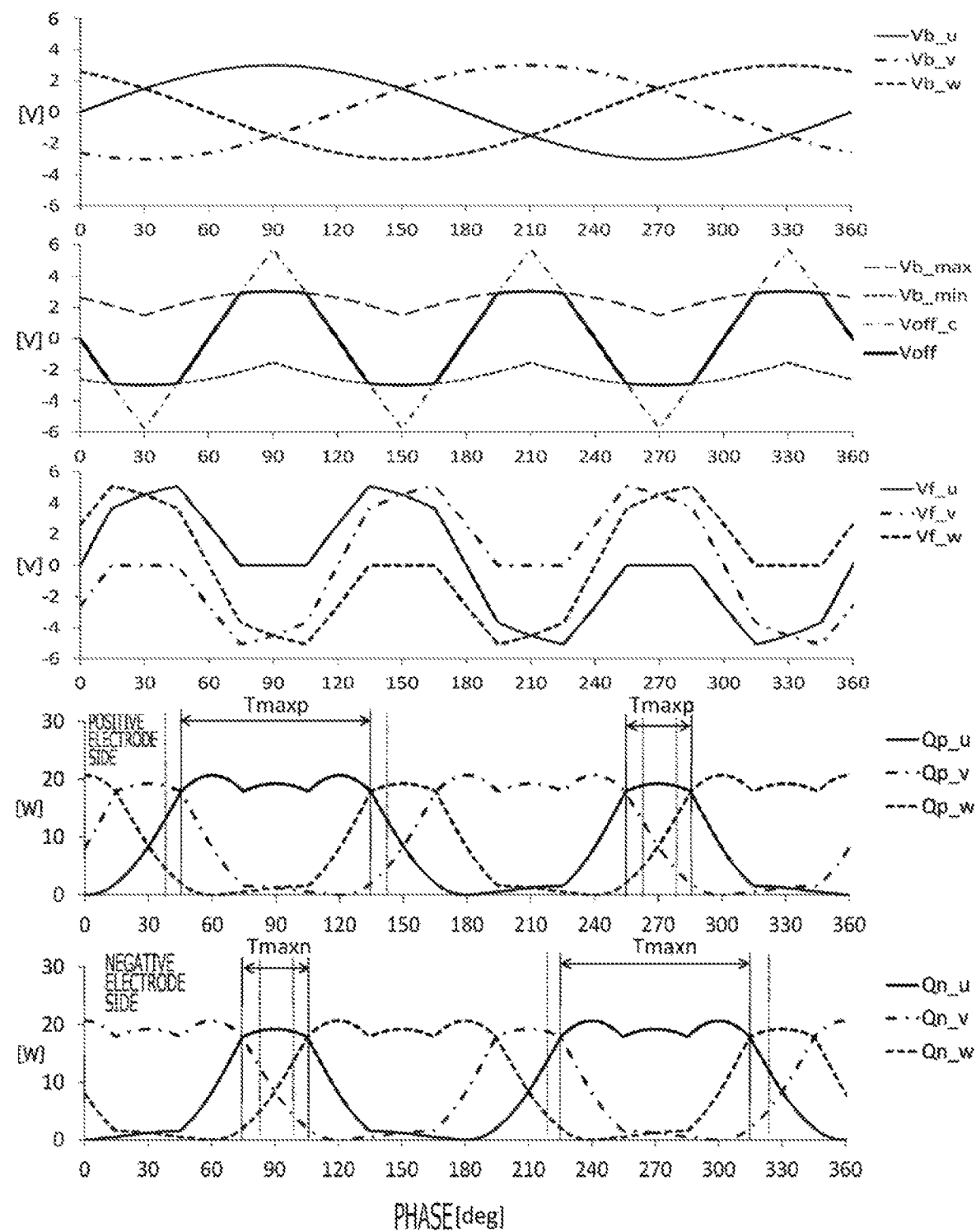
FIG. 8 is a time chart for explaining a control behavior according to Embodiment 1.

FIG. 7 shows the control behavior according to a comparative example in which the offset voltage Voff is set to 0 unlike the present embodiment. FIG. 8 shows an example of the control behavior according to the present embodiment. The heating evaluation value of the equation (4) is used in these examples. And, the DC voltage Vdc is 12V, the amplitude D of the AC voltage command basic values is 3V, the resistance R of winding is 15 mΩ, the rotational speed of the AC motor 3 is 0, and the frequency of the AC voltage command basic values is extremely low frequency. The horizontal axis of each graph is a phase of the AC voltage command basic values.

In the comparative example of FIG. 7, every time the phase changes by 30 degrees, the heating evaluation value of one switching device becomes significantly large compared with the heating evaluation value of other switching devices in order, and heat generation concentrates on the specific switching device. On the other hand, in the example of the present embodiment of FIG. 8, the heating evaluation value Qmaxp of the positive electrode side maximum heating switching device and the heating evaluation value Qmaxn of the negative electrode side maximum heating switching device coincide with each other, and the heating evaluation value of the maximum heating switching device can be minimized. As mentioned above, when the offset voltage Voff is increased too much in order to decrease the heating evaluation value Qmaxp of the positive electrode side maximum heating switching device, the heating evaluation value Qmaxn of the negative electrode side maximum heating switching device increases too much on the contrary. The heating evaluation value can be minimized by making Qmaxp and Qmaxn coincide. In the comparative example of FIG. 7, the maximum heating evaluation value is 28.8 W. On the other hand, in the example of the present embodiment of FIG. 8, the maximum heating evaluation value is 20.6 W, and can be reducing about 28%.

And, for example, a period Tmaxp when the switching device of U phase becomes the positive electrode side maximum heating switching device, and a period Tmaxn when the switching device of U phase becomes the negative electrode side maximum heating switching device are different between the comparative example of FIG. 7 and the example of the present embodiment of FIG. 8. Accordingly, as mentioned above, it is found that it is necessary to evaluate the positive electrode side maximum heating evaluation value Qmaxp and the negative electrode side maximum heating evaluation value Qmaxn with the combined AC voltage commands of the offset voltage Voff.

As a result of performing simulation under the same conditions as FIG. 7 and FIG. 8 using the method of PLT 1, and the method of PLT 2, the maximum heating evaluation value become 26.6 W and 22.7 W, respectively, and the method of the present embodiment can reduce the heating evaluation value more.

2. Embodiment 2

Next, the power converter 1 according to Embodiment 2 will be explained. The explanation for constituent parts the same as those in Embodiment 1 will be omitted. The basic configuration of the power converter 1 according to the present embodiment is the same as that of Embodiment 1. However, Embodiment 2 is different from Embodiment 1 in the average period of heating amount.

The temperature of the switching device changes in delay to heat generation of the switching device, due to the heat capacity and the cooling mechanism of the switching device. In other words, the heating amount of the switching device is averaged and appears in the temperature of the switching device. Therefore, even if the average value of the heating amount in the on/off control period is not controlled like Embodiment 1, by controlling an average value of the heating evaluation value in period which is longer than the on/off control period and shorter than the time constant of the delay of the temperature change of the switching device the heat generation of the switching device can be suppressed.

Since the heating evaluation value is calculated based on the total phase number of the AC voltage command basic values, by averaging the total phase number of the AC voltage command basic values which are used for calculation of the offset voltage Voff, the average value of the heating evaluation value can be controlled.

Figure 9:
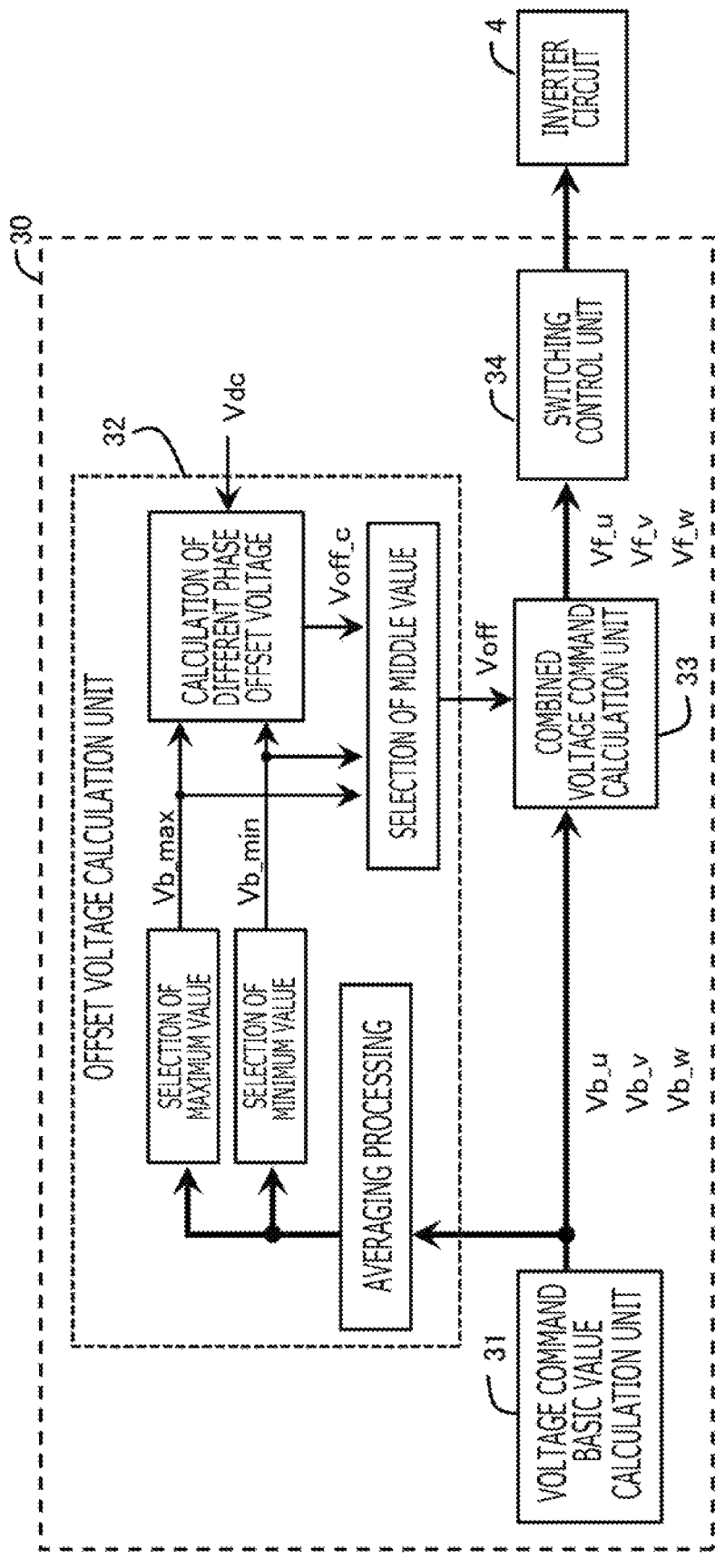
FIG. 9 is a block diagram of the controller according to Embodiment 2.

Then, in the present embodiment, as shown in the block diagram of FIG. 9, the offset voltage calculation unit 32 uses, for calculation of the offset voltage, average values of the total phase number of the AC voltage command basic values in an average period which is shorter than the time constant of the delay of the temperature change of the switching device to the heating amount change of the switching device, and is longer than the on/off control period.

In the present embodiment, the offset voltage calculation unit 32 uses a moving averaging processing, a low pass filter processing, or the like, as the averaging processing. The average period of the moving average is set to a period which is shorter than the time constant of delay of the temperature change of the switching device, and is longer than the on/off control period. The cutoff frequency of the low pass filter is set to a frequency which is larger than the reciprocal of the time constant of delay of the temperature change of the switching device, and is smaller than the reciprocal of the on/off control period.

Then, the offset voltage calculation unit 32 calculates the maximum value Vb_max of AC voltage command basic value (Voff_a), the minimum value Vb_min of AC voltage command basic value (Voff_b), and the different phase offset voltage Voff_c, based on the total phase number of the AC voltage command basic values after averaging processing, using the equation (14), the equation (15), and the equation (9-c2) or the equation (11-c2). Then, the offset voltage calculation unit 32 calculates the middle value in the maximum value Vb_max, the minimum value Vb_min, and the different phase offset voltage Voff_c, as the offset voltage Voff.

According to this configuration, since the average period can be adjusted, setting flexibility of the offset voltage Voff can be increased. And, sudden change of the offset voltage Voff can be suppressed by the averaging processing, and the noise component can be suppressed. Considering the accumulated heating amount in the averaging period, a value close to the temperature of the switching device can be set to the heating evaluation value. Accordingly, the heat generation of the switching devices can be distributed.

3. Embodiment 3

Next, the power converter 1 according to Embodiment 3 will be explained. The explanation for constituent parts the same as those in Embodiment 1 will be omitted. The basic configuration of the power converter 1 according to the present embodiment is the same as that of Embodiment 1. However, Embodiment 3 is different from Embodiment 1 in configuration that a high frequency component is combined to the offset voltage Voff.

Figure 10:
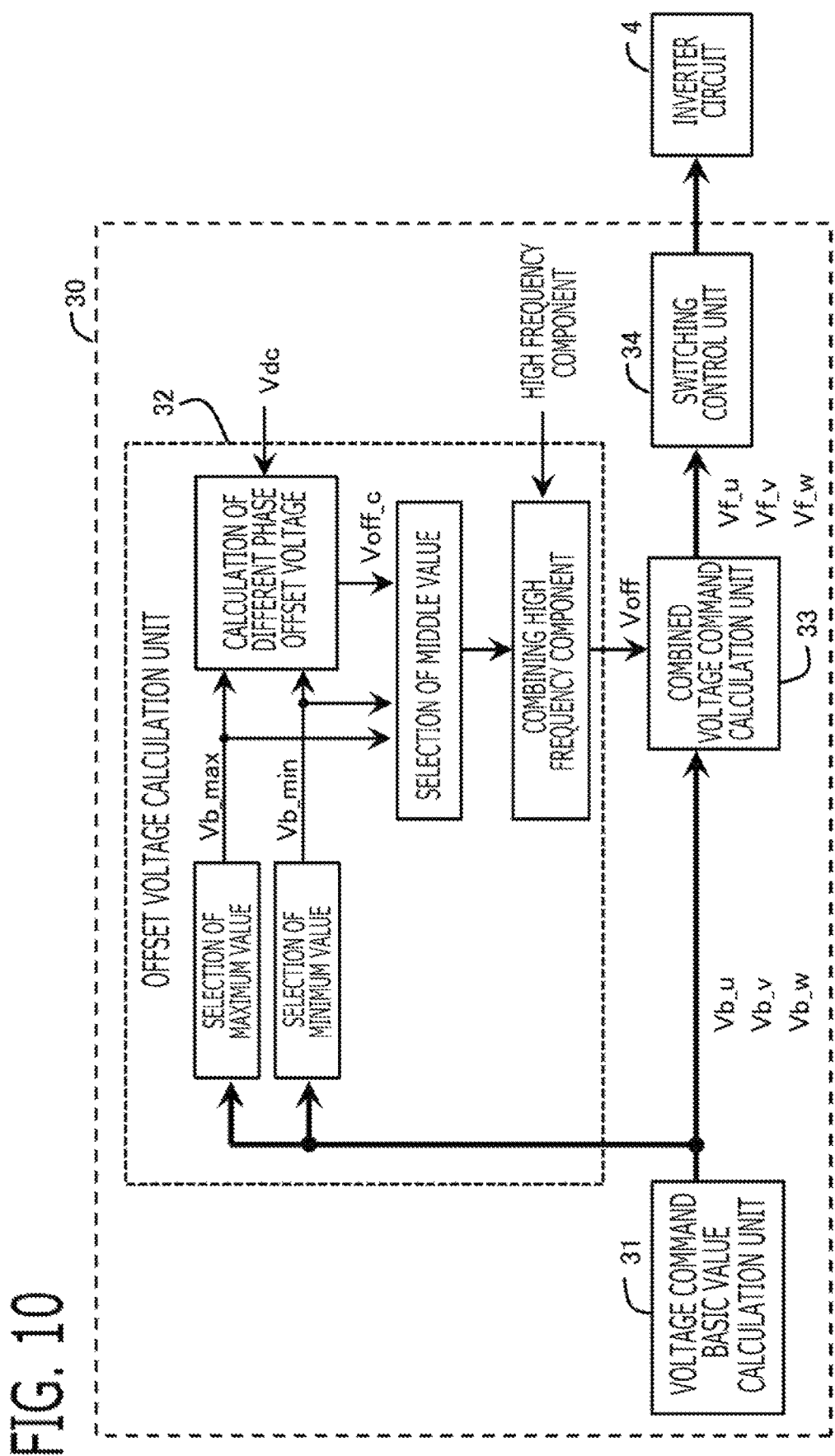
FIG. 10 is a block diagram of the controller according to Embodiment 3.

In the present embodiment, as shown in the block diagram of FIG. 10, the offset voltage calculation unit 32 combines a high frequency component to the offset voltage Voff which is set so that the positive electrode side maximum heating evaluation value Qmaxp and the negative electrode side maximum heating evaluation value Qmaxn coincide with each other. Then, the combined voltage command calculation unit 33 calculates the total phase number of combined AC voltage commands by combining the offset voltage Voff after combining the high frequency component to each of the total phase number of the AC voltage command basic values.

As the method of combining the offset voltage to the AC voltage commands, other than distribution of heat generation of the switching device like present disclosure, there are various previous methods such as the peak reduction of switching noise, and the reduction of switching loss.

For example, there is a high frequency component for shifting the on-off timing of the switching device forward and backward for every period. By this high frequency component, the frequency of the switching noise can be distributed in wide band, and the peak of noise spectrum can be reduced.

There is the method of calculating a high frequency component so that any one phase of the total phase number of the combined AC voltage commands is fixed to the upper limit voltage (in this example, Vdc/2) or the lower limit voltage (−Vdc/2). Accordingly, the switching frequency can be reduced, and the heat generation due to switching loss can also be reduced.

The high frequency component is a vibration component whose an average value in a period shorter than the time constant of delay of the temperature change of the switching device to the heating amount change of the switching device becomes 0. If the high frequency component is added, the heating evaluation value fluctuates, but the average value of the heating evaluation value in the period shorter than the time constant does not fluctuate. Even if the high frequency component is added, the temperature change of the switching device can be suppressed and the distribution effect of heat generation due to the offset voltage can be maintained. Therefore, the distribution of heat generation and other objects, such as the reduction of switching noise and the reduction of switching loss by the high frequency component, can be used together.

4. Embodiment 4

Next, the power converter 1 according to Embodiment 4 will be explained. The explanation for constituent parts the same as those in Embodiment 1 will be omitted. The basic configuration of the power converter 1 according to the present embodiment is the same as that of Embodiment 1. However, Embodiment 4 is different from Embodiment 1 in the calculation method of current.

In Embodiment 1, the current estimation value calculated based on the AC voltage command basic value is used for calculation of the different phase offset voltage Voff_c. In the present embodiment, the current detection value is used for calculation of the different phase offset voltage Voff_c.

Figure 11:
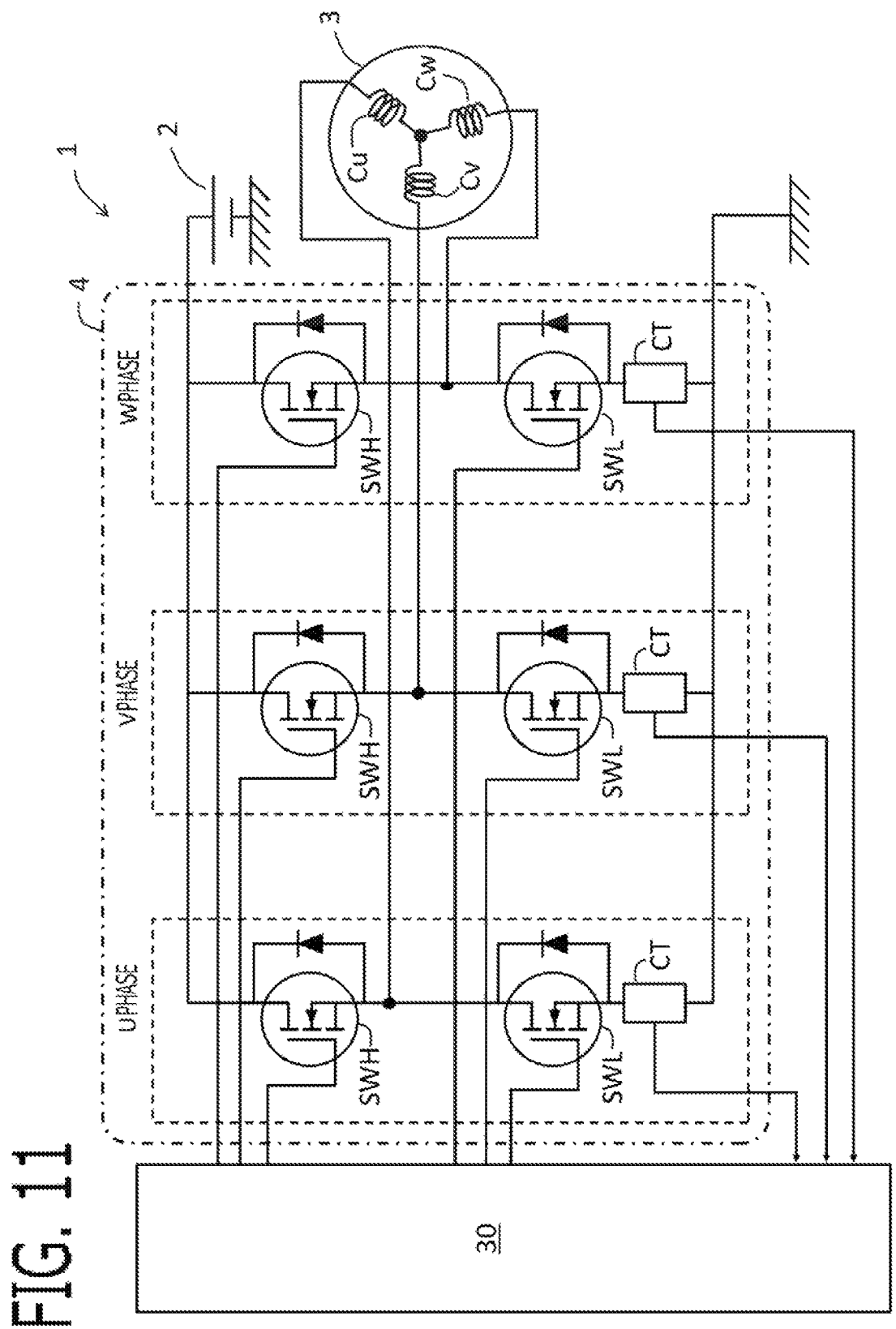
FIG. 11 is a whole configuration figure of the power converter according to Embodiment 4.

As shown in the schematic configuration diagram according to the present embodiment of FIG. 11. A current sensor CT connected in series to the negative electrode side switching device of each phase is provided. An output signal of the current sensor CT is inputted into the controller 30. Then, the controller 30 detects the current flowing into the winding of each phase based on the output signal of the current sensor CT of each phase. In the present embodiment, a current transformer is used for the current sensor CT. But, a shunt resistance or a Hall element may be used. The number of current sensors may be set less than or equal to two, and the offset voltage may be calculated by using together the current detection value and the current estimation value. The current sensor may be provided on the wire which connects the series circuit of each phase, and the winding of each phase, and may be provided on the wire which connects the DC power source 2 and the power converter 1.

Figure 12:
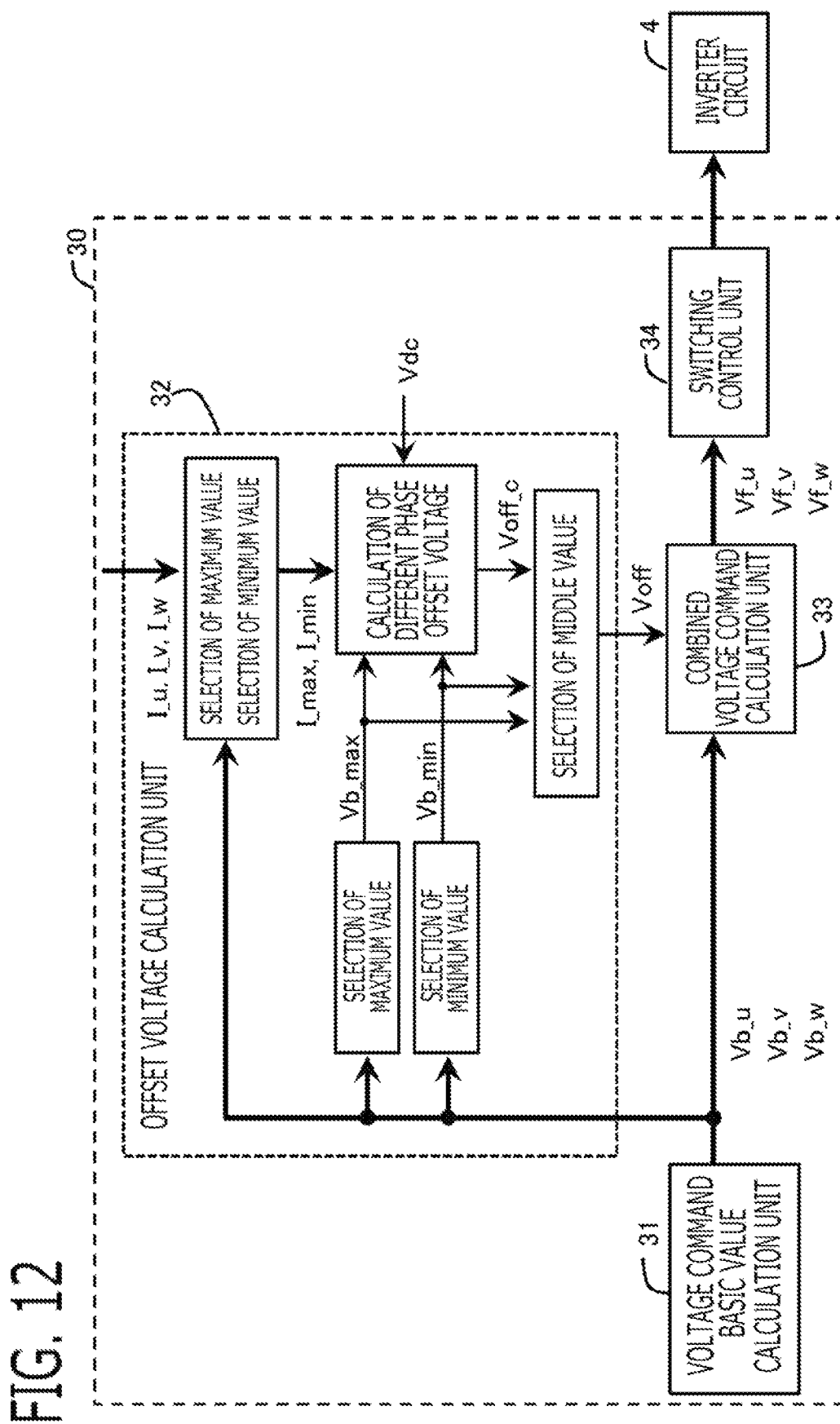
FIG. 12 is a block diagram of the controller according to Embodiment 4.

As shown in the block diagram of FIG. 12, the offset voltage calculation unit 32 selects the current which flows into the winding of the phase in which the AC voltage command basic value becomes the maximum, as the maximum current I_max, and selects the current which flows into the winding of the phase in which the AC voltage command basic value becomes the minimum, as the minimum current I_min.

In the case where the heating evaluation value of the equation (4) is employed, the offset voltage calculation unit 32 calculates the different phase offset voltage Voff_c based on the DC voltage Vdc, the maximum current Imax, the minimum current Imin, the maximum value Vb_max of AC voltage command basic value, and the minimum value Vb_min of AC voltage command basic value, using the equation (9-c).

In the case where the heating evaluation value of the equation (5) is employed, the offset voltage calculation unit 32 calculates the different phase offset voltage Voff_c based on the DC voltage Vdc, the maximum current Imax, the minimum current Imin, the maximum value Vb_max of AC voltage command basic value, and the minimum value Vb_min of AC voltage command basic value, using the equation (11-c).

Then, as similar to Embodiment 1, the offset voltage calculation unit 32 calculates the middle value in the maximum value Vb_max of AC voltage command basic value, the minimum value Vb_min of AC voltage command basic value, and the different phase offset voltage Voff_c, as the offset voltage Voff.

According to the present embodiment, even in the case where the law of Ohm cannot be used, such as the case where the electromotive force of the AC motor is generated and the case where the switching resistance cannot be ignored compared with the winding resistance, the heat generation of the switching device can be distributed with good accuracy using the current detection value.

5. Embodiment 5

Next, the power converter 1 according to Embodiment 5 will be explained. The explanation for constituent parts the same as those in Embodiment 1 will be omitted. The basic configuration of the power converter 1 according to the present embodiment is the same as that of Embodiment 1. However, Embodiment 5 is different from Embodiment 1 in configuration that calculation of the offset voltage is stopped in a predetermined operating condition, and the offset voltage is upper and lower limited.

When the rotational speed of the AC motor becomes high and the frequency of the total phase number of the AC voltage command basic values becomes high, the switching period of the maximum heating switching device becomes short. When this switching period is smaller than the time constant of delay of the temperature change of the switching device, even if the offset voltage is not combined, the deviation of the temperature rise of the switching device becomes low, and the necessity of combining the offset voltage becomes low. When the magnitude of current is small, and the temperature rise of the switching device is kept within tolerable range even if the offset voltage is not combined, there is no necessity of combining the offset voltage. Like these, there is driving condition in which it is not necessary to combine the offset voltage for the distribution of heat generation.

Figure 13:
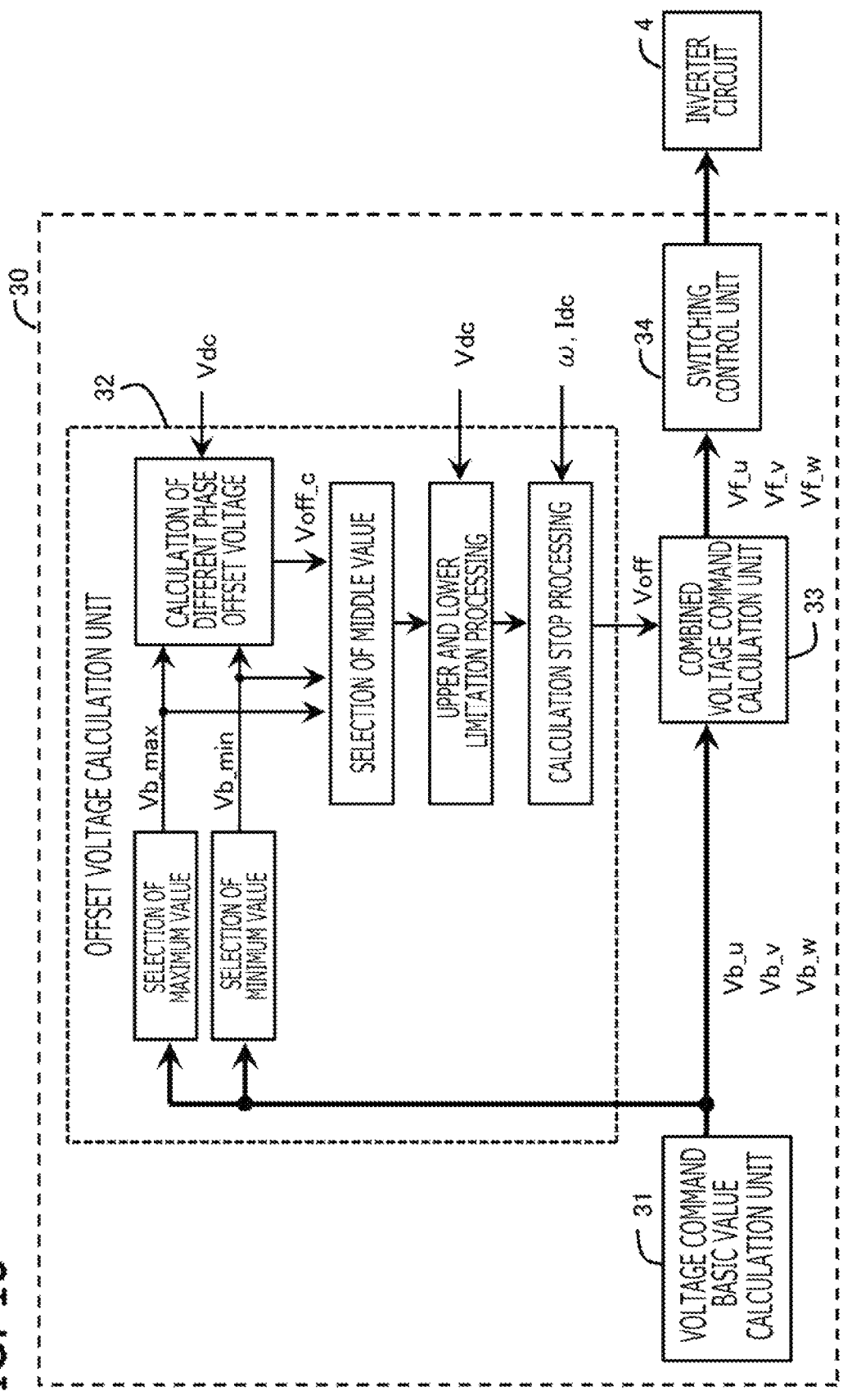
FIG. 13 is a block diagram of the controller according to Embodiment 5.

Then, as shown in the block diagram of FIG. 13, when the frequency of the total phase number of the AC voltage command basic values is higher than a preliminarily set determination frequency, or when the magnitude of the current flowing into an electric load is smaller than a preliminarily set determination current, the offset voltage calculation unit 32 stops calculation of the offset voltage Voff that makes the positive electrode side maximum heating evaluation value Qmaxp and the negative electrode side maximum heating evaluation value Qmaxn coincide with each other.

For example, as shown in an equation (16), when the magnitude of rotational angle speed w of AC voltage command basic value becomes larger than preliminarily set determination speed ω_INH, the offset voltage calculation unit 32 stops calculation processing of the offset voltage Voff that makes Qmaxp and Qmaxn coincide, and sets the offset voltage Voff to 0. The determination speed ω_INH is set to a rotational angle speed at which period of the AC voltage command basic value becomes shorter than the time constant of delay of the temperature change of the switching device. Accordingly, at the rotational angle speed at which the heating distribution is unnecessary, the calculation of the offset voltage Voff is stopped and the calculation processing load can be reduced.

$$|\omega|>\omega\_INH \tag{16}$$

As shown in an equation (17), when the magnitude of the DC current Idc flowing into the inverter circuit 4 from the DC power source 2 is smaller than a preliminarily set determination current I_INH, the offset voltage calculation unit 32 stops calculation processing of the offset voltage Voff that makes Qmaxp and Qmaxn coincide, and sets the offset voltage Voff to 0. Instead of the DC current Idc, the q-axis current on the dq-axis rotating coordinate system into which the total phase number of AC currents are converted may be used. In the current in which the heat generation can be allowed, the calculation of the offset voltage Voff is stopped and the calculation processing load can be reduced.

$$|Idc|<I\_INH \tag{17}$$

Since the combined AC voltage commands exceed the range from −Vdc/2 to +Vdc/2 when the amplitude D of the AC voltage command basic values becomes large, the appropriate voltage according to the AC voltage command basic value cannot be applied to the winding, and the ON period of the switching device bellows a period necessary for the current detection. Then, when the combined AC voltage command exceeds a preliminarily set range from a lower limit value to an upper limit value, the offset voltage calculation unit 32 changes the offset voltage Voff so that the combined AC voltage command becomes within the range from the lower limit value to the upper limit value.

For example, as shown in the equation (18-1) and the equation (18-2), when the combined voltage command (Vb_max−Voff) of the maximum value Vb_max of AC voltage command basic value becomes larger than the preliminarily set upper limit value Vf_pLim, or when the combined voltage command (Vb_min−Voff) of the minimum value Vb_min of AC voltage command basic value becomes smaller than preliminarily set lower limit value Vf_nLim, the offset voltage calculation unit 32 stops the calculation processing of the offset voltage Voff that makes Qmaxp and Qmaxn coincide, and sets the offset voltage Voff to 0. The upper limit value Vf_pLim is set to a value according to +Vdc/2, and the lower limit value Vf_nLim is set to a value according to −Vdc/2. The combined AC voltage command can be prevented from exceeding the range from the lower limit value to the upper limit value, the appropriate voltage can be applied to the winding, and the winding current can be detected with good accuracy.

$$Vb\_max-Voff>Vf\_pLim \tag{18-1}$$

$$Vb\_min-Voff<Vf\_nLim \tag{18-2}$$

Alternatively, when the equation (18-1) is established, the offset voltage calculation unit 32 changes the offset voltage Voff so that the combined voltage command (Vb_max−Voff) of the maximum value Vb_max of AC voltage command basic value coincides with the upper limit value Vf_pLim, using an equation (19-1). When the equation (18-2) is established, the offset voltage calculation unit 32 changes the offset voltage Voff so that the combined voltage command (Vb_min−Voff) of the minimum value Vb_min of AC voltage command basic value coincides with the lower limit value Vf_nLim, using an equation (19-2). Calculation of the combined AC voltage command within the appropriate range can be secured. While keeping the combined AC voltage command within the appropriate range, the distribution effect of heat generation can be obtained to the utmost.

$$Voff=Vb\_max-Vf\_pLim \tag{19-1}$$

$$Voff=Vb\_min-Vf\_nLim \tag{19-2}$$

Each of various calculations, such as the calculation stop processing of the offset voltage, and the upper and lower limitation processing of the offset voltage may be performed independently, and may be performed in combination.

6. Embodiment 6

Next, the power converter 1 according to Embodiment 6 will be explained. The explanation for constituent parts the same as those in Embodiment 1 will be omitted. The basic configuration of the power converter 1 according to the present embodiment is the same as that of Embodiment 1. In the present embodiment, the AC motor 3 is used as a driving force source of the electric power steering apparatus.

Figure 14:
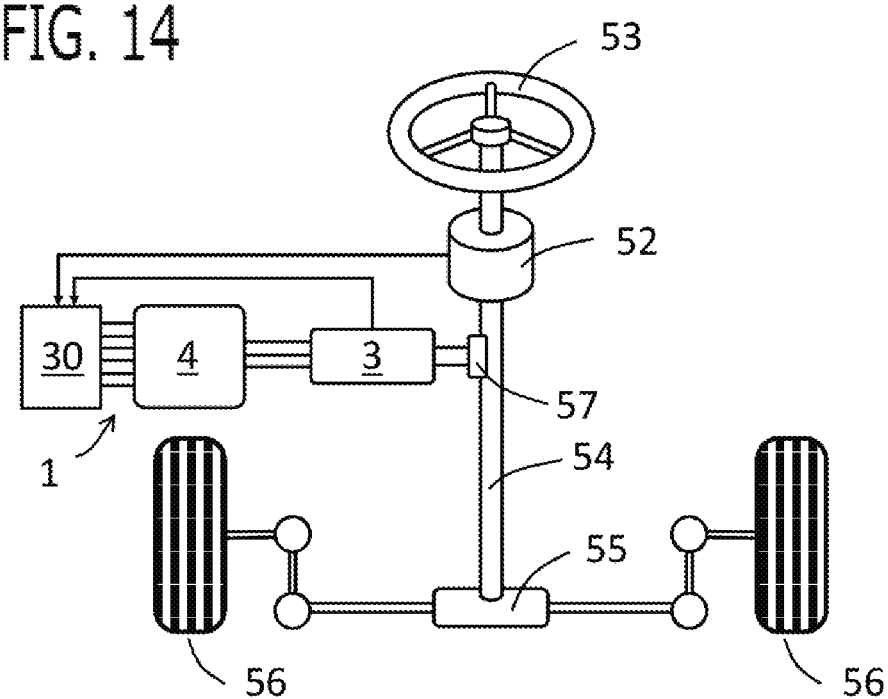
FIG. 14 is a whole configuration figure of the electric power steering apparatus according to Embodiment 6.

As shown in FIG. 14, a steering force of driver applied to a steering wheel 53 is transmitted to a steering shaft 54. The output torque of the AC motor 3 is transmitted to the steering shaft 54 via a reduction gear 57. The steering force of driver and the output torque of the AC motor 3 which are transmitted to the steering shaft 54 are transmitted to a rack via a rack and pinion gear 55, and steer wheels 56. The AC motor 3 outputs the torque which assists the steering of driver. A torque sensor 52 attached to the steering shaft 54 detects the steering force of driver. The AC motor 3 is provided with an angle sensor which detects the electrical angle of the rotor.

The controller 30 (the voltage command basic value calculation unit 31) calculates the total phase number of the AC voltage command basic values, based on the steering force of driver detected by the torque sensor 52, the electrical angle of the rotor of the AC motor 3, and the currents flowing into the windings of the AC motor 3.

A steering of the steering wheel 53 in the state where the vehicle speed is 0 is called as a stationary steering. At the stationary steering, there is a problem that a large current flows into the inverter circuit 4, and heat generation concentrates on the specific switching device. As similar to the above Embodiment 1, by calculating the offset voltage Voff which distributes heat generation, the deviation of temperature rise of the switching device can be reduced, and the number of the continuous stationary steering can be increased. A general-purpose inverter circuit, a cooling machine, and the like can also be applied, and the cost of the whole system can be reduced.

7. Embodiment 7

Next, the power converter 1 according to Embodiment 7 will be explained. The explanation for constituent parts the same as those in Embodiment 1 will be omitted. The basic configuration of the power converter 1 according to the present embodiment is the same as that of Embodiment 1. In the present embodiment, the AC motor 3 is used as a driving force source of wheels.

Figure 15:
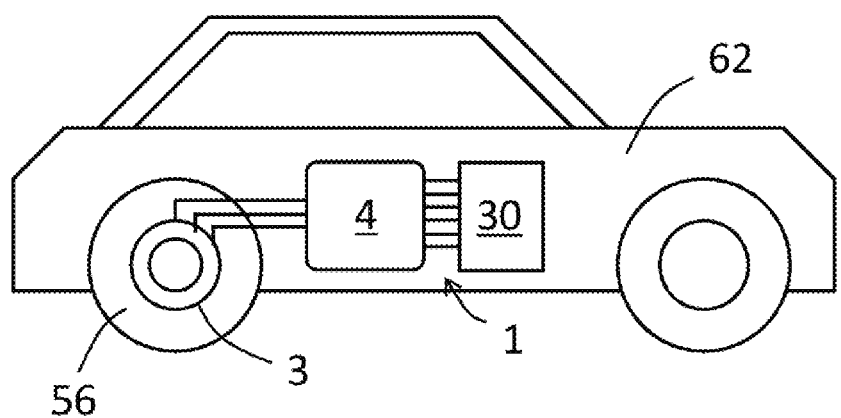
FIG. 15 is a whole configuration figure of the electric vehicle according to Embodiment 7.

As shown in FIG. 15, the AC motor 3 is used as a driving force source of wheels 56 of an electric vehicle 62 (or hybrid vehicle). The controller 30 (the voltage command basic value calculation unit 31) calculates the total phase number of the AC voltage command basic values, based on operation of an accelerator pedal of driver, the vehicle speed, and the like.

When the vehicle stops on uphill slope and the vehicle is held to the stop state by accelerator pedal adjustment of driver, there is a problem that the current flowing into the AC motor 3 increases in the state where the rotational speed of the AC motor 3 is extremely low, and the heat generation concentrates on the specific switching device. As similar to above Embodiment 1, by calculating the offset voltage Voff which distributes heat generation, the deviation of temperature rise of the switching device can be reduced. A general-purpose inverter circuit, a cooling machine, and the like can also be applied, and the cost of the whole system can be reduced.

8. Embodiment 8

Next, the power converter 1 according to Embodiment 8 will be explained. The explanation for constituent parts the same as those in Embodiment 1 will be omitted. The basic configuration of the power converter 1 according to the present embodiment is the same as that of Embodiment 1. In the present embodiment, the AC motor 3 is used as a driving force source of an elevator winding machine.

Figure 16:
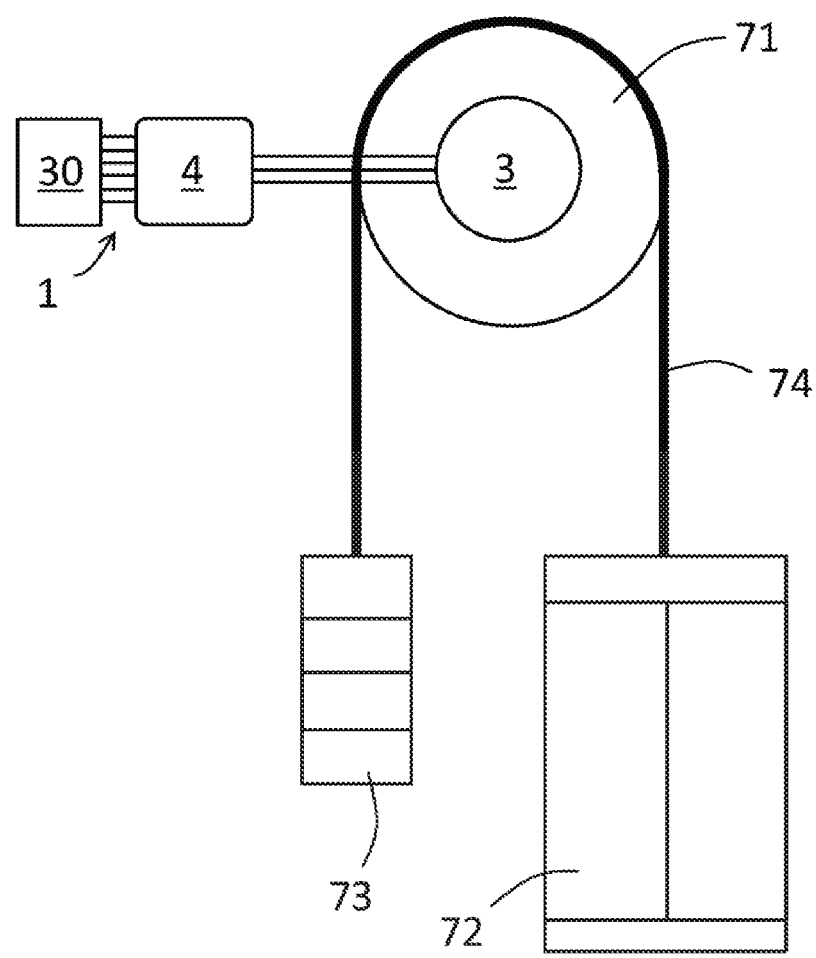
FIG. 16 is a whole configuration figure of the elevator according to Embodiment 8.

As shown in FIG. 16, a riding cage 72 and a balance weight 73 are connected by a rope 74. When the winding machine 71 winds up the rope 74, the riding cage 72 is moved. The balance weight 73 offsets the gravity of the riding cage 72, and it is effective in reducing torque necessary for the winding machine 71. The AC motor 3 is used as a driving force source of the winding machine 71.

The controller 30 (the voltage command basic value calculation unit 31) calculates the total phase number of the AC voltage command basic values, based on the electrical angle of the rotor of the AC motor 3, and the currents flowing into the windings of the AC motor 3, and the like.

When the current flowing into the AC motor 3 increases in the state where the rotational speed of the AC motor 3 is extremely low just after moving start of the riding cage 72, there is a problem that heat generation concentrates on the specific switching device. As similar to above Embodiment 1, by calculating the offset voltage Voff which distributes heat generation, the deviation of temperature rise of the switching device can be reduced.

OTHER EMBODIMENTS

Lastly, other embodiments of the present disclosure will be explained. Each of the configurations of embodiments to be explained below is not limited to be separately utilized but can be utilized in combination with the configurations of other embodiments as long as no discrepancy occurs.

(1) In each of the above-mentioned Embodiments, there has been explained the case where the total phase number is set to three. However, embodiments of the present disclosure are not limited to the foregoing case. That is to say, the total phase number may be set greater than or equal to three. For example, even if the total phase number is set to four and the induction motor has four phase windings, the offset voltage calculation unit 32 calculates the maximum value Vb_max and the minimum value Vb_min in the AC voltage command basic values of 4-phase, calculates the different phase offset voltage Voff_c based on the maximum value Vb_max and the minimum value Vb_min, and calculates the middle value in the maximum value Vb_max, the minimum value Vb_min, and the different phase offset voltage Voff_c, as the offset voltage Voff.

(2) In each of the above-mentioned Embodiments, there has been explained the case where the AC motor 3 is the induction motor. However, embodiments of the present disclosure are not limited to the foregoing case. That is to say, the AC motor 3 may be a permanent magnet type or electromagnet type synchronous motor, and the total phase number of the electric loads may be the total phase number of the windings provided in the synchronous motor. In the case of the synchronous motor, the period of the AC voltage command basic value is equal to the rotation period in the electrical angle of the rotor. The AC motor 3 may have one or both of the function of a motor and the function of a generator.

(3) In the above-mentioned Embodiments 6 to 9, there has been explained the case where the AC motor 3 is used as the driving force source of the electric power steering apparatus, the wheels, or the winding machine of the elevator. However, embodiments of the present disclosure are not limited to the foregoing case. That is to say, the AC motor 3 may be used for various apparatus.

(4) In each of the above-mentioned Embodiments, there has been explained the case where the total phase number of the electric loads are the total phase number of the windings provided in the AC motor 3. However, embodiments of the present disclosure are not limited to the foregoing case. That is to say, the total phase number of the electric loads may be various circuits of three or more phase which can be expressed by resistance and inductance.

(5) In each of the above-mentioned Embodiments, there has been explained the case where the total phase number of the AC voltage command basic values vibrate centering on 0. However, embodiments of the present disclosure are not limited to the foregoing case. That is to say, the total phase number of the AC voltage command basic values may vibrate centering on Vdc/2. In this case, as the maximum value Vb_max and the minimum value Vb_min in the equation (9-c), the equation (9-c2), the equation (11-c), and the equation (11-c2), values obtained by subtracting Vdc/2 from the maximum value and the minimum value of the AC voltage command basic values which vibrate centering on Vdc/2 may be used. In this case, the switching control unit 34 uses the carrier wave which vibrates centering on Vdc/2 with the amplitude of the DC voltage Vdc/2 at the on/off control period (PWM period).

(6) In the above-mentioned Embodiment 2, there has been explained the case where the estimation value of the current calculated based on the AC voltage command basic value is used as the current, and the value obtained by performing the averaging processing to the AC voltage command basic value is used for calculation of the offset voltage. However, embodiments of the present disclosure are not limited to the foregoing case. That is to say, in the case where the current detection value is used as the current like Embodiment 4, the value obtained by performing the averaging processing to the AC voltage command basic value, and the current detection value may be used for calculation of the offset voltage.

Although the present disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

REFERENCE SIGNS LIST

I_max Maximum current, I_min Minimum current, Qmaxn Negative electrode side maximum heating evaluation value, Qmaxp Positive electrode side maximum heating evaluation value, Vb_max Maximum value in the total phase number of the AC voltage command basic values, Vb_min Minimum value in the total phase number of the AC voltage command basic values, Vdc DC voltage, Voff Offset voltage, Voff_c Different phase offset voltage, 1 Power converter, 2 DC power Source, 3 AC motor, 4 Inverter circuit, 30 Controller, 31 Voltage command basic value calculation unit, 32 Offset voltage calculation unit, 33 Combined voltage command calculation unit, 34 Switching control unit

What is claimed is:

1. A power converter which converts from a DC power source to AC power supplied to a total phase number, which is set to greater than or equal to three, of electric loads, the power converter comprising:
    an inverter circuit that is provided with the total phase number of series circuits in each of which a positive electrode side switching device connected to a positive electrode side of the DC power source and a negative electrode side switching device connected to a negative electrode side of the DC power source are connected in series and which a connection node of series connection is connected to the electric load of corresponding phase;
    a voltage command basic value calculator that calculates the total phase number of AC voltage command basic values;
    an offset voltage calculator that calculates an offset voltage;
    a combined voltage command calculator that calculates the total phase number of combined AC voltage commands by combining the offset voltage to each of the total phase number of the AC voltage command basic values; and
    a switching controller that controls on/off the switching devices of each of the total phase number of the series circuits, based on each of the total phase number of the combined AC voltage commands,
    wherein the offset voltage calculator calculates the offset voltage that makes a positive electrode side maximum heating evaluation value and a negative electrode side maximum heating evaluation value coincide with each other, in a state of controlling on/off the switching devices based on the combined AC voltage commands,
    wherein the positive electrode side maximum heating evaluation value is an evaluation value of the positive electrode side switching device whose an evaluation value of heating amount becomes maximum in the total phase number of the positive electrode side switching devices, and
    wherein the negative electrode side maximum heating evaluation value is an evaluation value of the negative electrode side switching device whose an evaluation value of heating amount becomes maximum in the total phase number of the negative electrode side switching devices.

2. The power converter according to claim 1, wherein the offset voltage calculator calculates a different phase offset voltage which is the offset voltage that makes the positive electrode side maximum heating evaluation value and the negative electrode side maximum heating evaluation value coincide with each other, on the supposition that a phase of the positive electrode side switching device whose the evaluation value becomes the maximum and a phase of the negative electrode side switching device whose the evaluation value becomes the maximum are different phases, and calculates a middle value in a maximum value in the total phase number of the AC voltage command basic values, a minimum value in the total phase number of the AC voltage command basic values, and the different phase offset voltage, as the offset voltage.

3. The power converter according to claim 1, wherein the evaluation value of heating amount of each of the switching devices is a value calculated based on a current which flows from the series circuit of phase corresponding to the switching device into the electric load and the combined AC voltage command of phase corresponding to the switching device.

4. The power converter according to claim 1, wherein the offset voltage calculator calculates the offset voltage so as to coincide the positive electrode side maximum heating evaluation value and the negative electrode side maximum heating evaluation value, each of which uses, as the evaluation value, an average value of the evaluation value in an average period shorter than a time constant of a delay of temperature change of the switching device to heating amount change of the switching device.

5. The power converter according to claim 4, wherein the average period is set to an on/off control period of the switching devices.

6. The power converter according to claim 3, wherein as the current, a current estimation value calculated based on the AC voltage command basic value of corresponding phase is used.

7. The power converter according to claim 6, wherein the offset voltage calculator uses, for calculation of the offset voltage, average values of the total phase number of the AC voltage command basic values in an average period which is shorter than a time constant of a delay of temperature change of the switching device to heating amount change of the switching device, and is longer than an on/off control period of the switching devices.

8. The power converter according to claim 3, wherein as the current, a current detection value is used.

9. The power converter according to claim 8, wherein the offset voltage calculator uses, for calculation of the offset voltage, average values of the total phase number of the AC voltage command basic values and the current detection values in an average period which is shorter than a time constant of a delay of temperature change of the switching device to heating amount change of the switching device, and is longer than an on/off control period of the switching devices.

10. The power converter according to claim 1, wherein the offset voltage calculator further combines, to the offset voltage, a vibration component whose an average value in a period shorter than a time constant of a delay of temperature change of the switching device to heating amount change of the switching device becomes 0.

11. The power converter according to claim 1, wherein when a frequency of the total phase number of the AC voltage command basic values is higher than a preliminarily set determination frequency, or when current which flows into the electric load is smaller than a preliminarily set determination current, the offset voltage calculator stops calculation of the offset voltage.

12. The power converter according to claim 1, wherein when the total phase number of the AC voltage command basic values exceed a preliminarily set range from a lower limit value to an upper limit value, the offset voltage calculator changes the offset voltage so that the total phase number of the combined AC voltage commands become within the range from the lower limit value to the upper limit value.

13. The power converter according to claim 1, wherein the total phase number of the electric loads are the total phase number of windings provided in the AC motor.

14. The power converter according to claim 13, wherein the AC motor is used as a driving force source of an electric power steering apparatus.

15. The power converter according to claim 13, wherein the AC motor is used as a driving force source of wheels.

16. The power converter according to claim 13, wherein the AC motor is used as a driving force source of an elevator winding machine.

17. A power converter which converts from a DC power source to AC power supplied to a total phase number, which is set to greater than or equal to three, of electric loads, the power converter comprising:

an inverter circuit that is provided with the total phase number of series circuits in each of which a positive electrode side switching device connected to a positive electrode side of the DC power source and a negative electrode side switching device connected to a negative electrode side of the DC power source are connected in series and which a connection node of series connection is connected to the electric load of corresponding phase;

a voltage command basic value calculator that calculates the total phase number of AC voltage command basic values;

an offset voltage calculator that calculates an offset voltage;

a combined voltage command calculator that calculates the total phase number of combined AC voltage commands by combining the offset voltage to each of the total phase number of the AC voltage command basic values; and a switching controller that controls on/off the switching devices of each of the total phase number of the series circuits, based on each of the total phase number of the combined AC voltage commands, wherein setting a different phase offset voltage to Voff_c, setting a DC voltage of the DC power source to Vdc, setting a current which flows into the electric load of phase in which the AC voltage command basic value becomes the maximum to I_max, setting a current which flows into the electric load of phase in which the AC voltage command basic value becomes the minimum to I_min, setting a maximum value in the total phase number of the AC voltage command basic values which are adjusted so as to vibrate centering on 0 to Vb_max, and setting a minimum value in the total phase number of the AC voltage command basic values which are adjusted so as to vibrate centering on 0 to Vb_min, the offset voltage calculator calculates the different phase offset voltage using a calculation equation of $$Voff\_c=Vdc/2\times(I\_max^2-I\_min^2)/(I\_max^2+I\_min^2)+(Vb\_max\times I\_max^2+Vb\_min\times I\_min^2)/(I\_max^2+I\_min^2),$$

or $$Voff\_c=Vdc/2\times(I\_max+I\_min)/(I\_max-I\_min)+(Vb\_max\times I\_max-Vb\_min\times I\_min)/(I\_max-I\_min)$$

and calculates a middle value in a maximum value in the total phase number of the AC voltage command basic values, a minimum value in the total phase number of the AC voltage command basic values, and the different phase offset voltage, as the offset voltage.

* * * * *